(12) United States Patent
Said

(10) Patent No.: US 11,079,461 B2
(45) Date of Patent: Aug. 3, 2021

(54) CONSISTENT ARRIVAL TIME MEASUREMENT AND DETERMINATION OF DISCHARGE POLARITY

(71) Applicant: Vaisala, Inc., Louisville, CO (US)

(72) Inventor: Ryan K. Said, Broomfield, CO (US)

(73) Assignee: Vaisala, Inc., Louisville, CO (US)

( * ) Notice: Subject to any disclaimer, the term of this patent is extended or adjusted under 35 U.S.C. 154(b) by 353 days.

(21) Appl. No.: 16/298,379

(22) Filed: Mar. 11, 2019

(65) Prior Publication Data
US 2020/0292653 A1 Sep. 17, 2020

(51) Int. Cl.
G01S 1/04 (2006.01)
G01S 1/80 (2006.01)
G01S 11/10 (2006.01)

(52) U.S. Cl.
CPC .............. G01S 1/047 (2013.01); G01S 1/045 (2013.01); G01S 1/805 (2013.01); G01S 11/10 (2013.01)

(58) Field of Classification Search
CPC ... G01S 1/47; G01S 1/45; G01S 1/805; G01S 11/10
USPC ............................................ 342/26 R, 44, 70
See application file for complete search history.

(56) References Cited

U.S. PATENT DOCUMENTS

| | | | |
|---|---|---|---|
| 7,460,956 B2 | 12/2008 | Murphy et al. | |
| 8,073,622 B2* | 12/2011 | Said ........................ | G01W 1/16 702/4 |
| 2014/0155082 A1 | 6/2014 | Krauss et al. | |
| 2016/0313445 A1* | 10/2016 | Bailey ................... | G01S 7/4816 |
| 2018/0120256 A1* | 5/2018 | Kawano ........... | G01N 27/44791 |
| 2018/0288849 A1 | 10/2018 | Nag et al. | |
| 2018/0353107 A1* | 12/2018 | Xu ...................... | A61B 5/02438 |

FOREIGN PATENT DOCUMENTS

EP 3282275 A1 2/2018
WO 03/069375 A2 8/2003

OTHER PUBLICATIONS

Extended European Search Report for European Application No. 20159746.5 dated Nov. 17, 2020.
Honma, Noriyasu, et al. "Improved lightning locations in the Tohoku region of Japan using propagation and waveform onset corrections." IEEJ Transactions on Power and Energy133.2 (2013): 195-202, 8 pgs.
Uman Martin A., D. Kenneth McLain, and E. Philip Krider. "The electromagnetic radiation from a finite antenna." American Journal of Physics 43.1 (1975): 33-38, 6 pgs.

(Continued)

*Primary Examiner* — Bo Fan
(74) *Attorney, Agent, or Firm* — Maschoff Brennan; Paul G. Johnson

(57) ABSTRACT

Example methods and systems described herein relate to determining average arrival time of a radio wave emitted by a lightning discharge and/or determining the lobe and/or polarity of the radio wave. The determination of the average arrival time may take a weighted average of arrival times of peaks of the radio wave. The determination of the lobe and/or polarity may depend on an estimated propagation distance, a propagation path profile, and one or more waveform features.

21 Claims, 10 Drawing Sheets

(56) References Cited

OTHER PUBLICATIONS

Pessi, et al., "Development of a Long-Range Lightning Detection Network for the Pacific: Construction, Calibration, and Performance", Journal of Atomospheric and Oceanic Technology, vol. 26, Feb. 1, 2009 (145-166), 22 pgs.
Lee, "An experimental study of the remote location of lightning flashes using a VLF arrival time difference technique", Quarterly Journal of the Royal Meteorological Society, vol. 112, Issue 471, Jan. 1986 (203-229), 27 pgs.
Dowden, et al., "VLF lightning location by time of group arrival (TOGA) at multiple sites", Journal of Atmospheric and Solar-Terrestrial Physics, vol. 64, Issue 7, May 2002 (817-830) 14 pgs.
Said, "Towards a global lightning locating system" Weather, vol. 72, Issue 2, Feb. 3, 2017 (36-40) 5 pgs.
European Application No. 20159746.5, Partial Search Report dated Jul. 10, 2020.
Shi DongDong et al., "Low-frequency E-field Detection Array (LFEDA) Construction and preliminary results", Science China Earth Sciences, Science China Press, Heidelberg, vol. 60, Issue No. 10, pp. 1896-1908, Sep. 1, 2017.

\* cited by examiner

CONSISTENT ARRIVAL TIME MEASUREMENT AND DETERMINATION OF DISCHARGE POLARITY

FIELD

The embodiments discussed herein are related to consistent arrival time measurement and determination of discharge polarity in global-scale ground-based lightning locating systems (LLSs).

BACKGROUND

Unless otherwise indicated herein, the materials described herein are not prior art to the claims in the present application and are not admitted to be prior art by inclusion in this section.

Lightning discharges are characterized by powerful current processes that either lower charge to the ground or partially neutralize charge separation within or between clouds. Some ground-based lightning locating systems (LLSs) may measure radio waves from these current processes at multiple lightning detection sensors to geolocate each lightning discharge. LLSs may estimate the discharge time and the location of each lightning discharge. In addition to the foregoing (and, in some short-baseline networks, altitude), some LLSs can estimate other properties of the discharge, including the effective peak current magnitude and polarity (e.g., whether positive or negative charge was lowered by the lightning discharge).

The subject matter claimed herein is not limited to embodiments that solve any disadvantages or that operate only in environments such as those described above. Rather, this background is only provided to illustrate one example technology area where some embodiments described herein may be practiced.

SUMMARY

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Some embodiments described herein generally relate to consistent arrival time measurement and/or determination of discharge polarity in ground-based LLSs.

In an example embodiment, a method to determine average arrival time of a radio wave may include receiving a radio wave emitted by a lightning discharge. The method may also include generating a waveform signal that represents the radio wave, the waveform signal including multiple peaks. The method may also include determining multiple peak magnitudes for the peaks, including determining a corresponding peak magnitude for each of the peaks. The method may also include determining at least two arrival times for at least two of the peaks, including determining a corresponding arrival time for each of the at least two of the peaks. The method may also include determining an average arrival time of the radio wave at the lightning detection sensor based on at least two of the peak magnitudes and based on the at least two of the arrival times.

In another example embodiment, a lightning detection sensor may include an antenna, an analog-to-digital converter (ADC), a processor device, and a computer storage medium. The antenna may be configured to receive a radio wave emitted by a lightning discharge. The ADC may be operatively coupled to the antenna. The antenna and the ADC together may be configured to generate a waveform signal that represents the radio wave. The waveform signal may include multiple peaks. The processor device may be operatively coupled to the ADC. The computer storage medium may be operatively coupled to the processor device. The computer storage medium may have computer-readable instructions stored thereon that are executable by the processor device to perform or control performance of operations. The operations may include determining multiple peak magnitudes for the peaks, including determining a corresponding peak magnitude for each of the peaks. The operations may include determining at least two arrival times for at least two of the peaks, including determining a corresponding arrival time for each of the at least two of the peaks. The operations may include determining an average arrival time of the radio wave at the lightning detection sensor based on at least two of the peak magnitudes and based on the at least two of the arrival times.

In another example embodiment, a method to determine polarity of a lightning discharge method may include receiving, from a lightning detection sensor, waveform features extracted from a waveform signal that represents a radio wave emitted by a lightning discharge. The waveform signal may include multiple peaks. The waveform features may include at least a first peak magnitude and a first arrival time of a first peak of the waveform signal. The method may also include determining a polarity of the first peak. The method may also include determining an estimated propagation distance of the radio wave from the lightning discharge to the lightning detection sensor. The method may also include determining a propagation path profile of a propagation path of the radio wave from the lightning discharge to the lightning detection sensor. The method may also include determining whether the first peak represents a ground wave from the lightning discharge or an nth ionospheric reflection of the ground wave based on the estimated propagation distance, the propagation path profile, and at least some of the waveform features, where n is a positive integer. The method may also include determining a sensor-specific polarity of the lightning discharge for the lightning detection sensor based on the determined polarity of the first peak and the determination of whether the first peak represents the ground wave or the nth ionospheric reflection Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DESCRIPTION OF EMBODIMENTS

Figure 1:
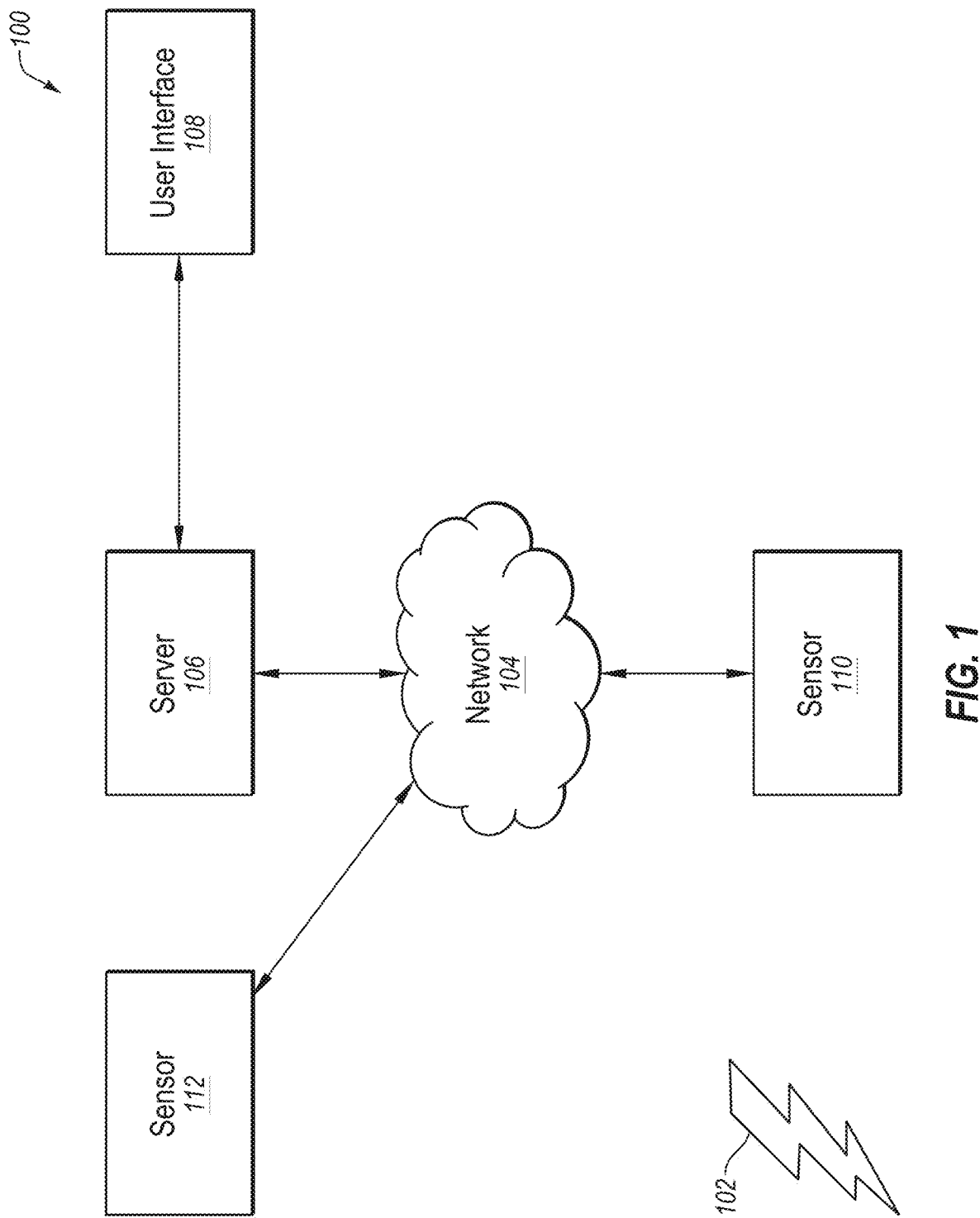
FIG. 1 is an example lightning detection system that may be used to make average arrival time determinations and/or discharge polarity determinations.

The detailed description set forth below includes a description of various configurations of the subject technology and is not intended to represent the only configurations in which the subject technology may be practiced. The detailed description includes specific details for the purpose of providing a thorough understanding of the subject technology. However, the subject technology may be practiced without these specific details. In some instances, well-known structures and components are not shown, or are shown schematically, to avoid obscuring the concepts of the subject technology.

Lightning discharges that generate significant radiation in the Very Low Frequency (VLF) (3-30 kilohertz (kHz)) and Low Frequency (LF) (30-300 kHz) ranges may be categorized as cloud-to-ground (CG) strokes or cloud pulses, where a CG stroke is a lightning discharge that connects a charge region in a cloud to the ground, and where a cloud pulse may be a lightning discharge that connects regions with opposite polarity within one cloud or between multiple clouds. An operational VLF/LF sensor may measure frequency less than or equal to about 500 kHz.

LLSs are evaluated by multiple performance metrics, including the spatial precision by which lightning discharges are geolocated, and the fraction of all lightning discharges detected by the network. Some embodiments described herein relate to two of these metrics in the context of a global LLS: the spatial precision and the ability to determine the polarity of each event. The embodiments related to each of these two metrics may be implemented together or separately. These performance metrics are relevant to a variety of applications. Spatial precision may be relevant to applications that leverage lightning data, including warning, energy, and meteorological applications. Polarity may be used as an input to source type classification (e.g., to determine whether the lightning discharge is a CG stroke or a cloud pulse), as a proxy along with peak current magnitude for damages to ground assets, and as an input to track the morphology of a thunderstorm.

LLSs may rely on detecting radio waves emitted by a lightning discharge, also referred to as lightning pulses, that have propagated a significant distance in the Earth-ionosphere waveguide, where the Earth-ionosphere waveguide is bounded by the Earth on the lower end and by the ionosphere on the upper end. The ionosphere is the ionized portion of the Earth's upper atmosphere located from approximately 60 kilometers (km) to 1,000 km in altitude. The ionosphere is composed of plasma (i.e., positive ions and free flowing electrons), which is sustained by ionizing radiation from solar radiation during the day and cosmic rays during the night. Extremely low frequency (ELF) signals (300 hertz (Hz)-3 kHz) and VLF signals can propagate efficiently within the Earth-ionosphere waveguide, since the ionosphere acts as an efficient reflector at ELF and VLF frequencies.

Thus, lightning detection done on a global scale may be accomplished by measuring radio waves having a frequency below approximately 50 kHz that have reflected off of the ionosphere and have been redirected towards the Earth (i.e., subionospheric propagation in the Earth-ionosphere waveguide). Long-range VLF networks that rely on ionospheric reflections can leverage this efficient propagation to monitor and locate lightning discharges across large geographic areas with relatively few sensors.

Modern LLSs use arrival time measurements at multiple lightning detection sensors, or arrival time difference measurements among pairs of sensors, to determine the time and source coordinates of the discharge. The arrival angle can be used to introduce redundancy and for sensor correlation heuristics, but for a global LLS, the location accuracy may be largely dictated by the consistency of the arrival time measurements. Thus, improving the location accuracy is tied to decreasing the uncertainty in arrival time measurements at individual lightning detection sensors.

Shorter baseline networks can rely on measuring the ground wave, which diffracts over the surface of the earth from the source to the sensor. However, global LLSs must rely on ionospheric reflections to measure lightning pulses at long range. Based on the ionospheric reflection height, which is different under a daytime versus a nighttime ionosphere, the arrival time of these reflections can be delayed by many 10s of microseconds with respect to the ground wave. Furthermore, at a given relative threshold with respect to the maximum peak of a waveform signal that represents the radio wave emitted by the lightning discharge, the detected lobe (e.g., ground wave, first ionospheric reflection, second ionospheric reflection, etc.) at a given distance is not constant: for some lightning discharges, the lightning detection sensor may detect the ground wave at a given threshold; for others, the first ionospheric reflection. At larger distances, there may be an uncertainty between the first and second reflection. At still larger distances, there may be an uncertainty between the second and third reflection, and so on. Hence global LLSs as described herein may implement a more nuanced approach to estimating arrival time compared to shorter-baseline networks.

For example, some embodiments described herein may take a weighted average of one or more arrival times of one or more peaks in a waveform signal that represents a radio wave emitted by a lightning discharge to determine an average arrival time of the radio wave. The weighted average may consider the peak(s) preceding and including a maximum peak that has a maximum peak magnitude compared to peak magnitudes of the other peaks. In some embodiments, the peak(s) preceding and including the maximum peak may include all peaks that precede the maximum peak and that have a peak magnitude greater than or equal to the maximum peak magnitude multiplied by a constant between 0 and 1. In some embodiments, the constant may be 0.35.

The average arrival time may be computed as a weighted average of arrival times (e.g., onset-corrected arrival times) of the peaks weighted by relative magnitude jumps between adjacent peaks, where the peaks considered may be limited to any and all peak(s) preceding and including the maximum peak. Accordingly, some embodiments may derive the average arrival time from the early portions of the corresponding waveform signal. As such, this technique may be relatively invariant to more complicated current source waveforms, such as a cloud pulse train or a complicated falling edge of the first return stroke in a CG stroke. In addition, embodiments of this technique to determine average arrival time may vary smoothly with distance as the radio wave, and thus the waveform signal, changes due to subsequent ionospheric reflections of the radio wave. At close range, the ground wave may be the maximum peak, and so the average arrival time may equal the arrival time for the ground wave. At a distance where the first ionospheric reflection exceeds the magnitude of the ground wave, the delayed arrival time of the first ionospheric reflection may "drag" the average arrival time to a later value. However, this drag occurs slowly with distance, weighted by the relative magnitude increase of the first reflection relative to the ground wave. This measurement may similarly vary smoothly as subsequent ionospheric reflections increase in magnitude.

There are various methods to measure the arrival time of any given peak in the waveform signal. Some example methods include taking the last zero-crossing time before the peak as the arrival time of the peak, calculating an onset-corrected arrival time as the arrival time of the peak, or taking the time at which the amplitude crosses a fixed fraction of the peak amplitude as the arrival time of the peak. An example of calculating onset-corrected arrival time is disclosed in Honma, Noriyasu, et al. "Improved lightning locations in the Tohoku Region of Japan using propagation and waveform onset corrections." *IEEJ Transactions on Power and Energy* 133.2 (2013): 195-202 (hereinafter "Honma"), which is incorporated herein by reference. In some embodiments described herein, the onset-corrected arrival time of each peak is used as the arrival time of the peak. However, the embodiments described herein may use any of these or other arrival time techniques to determine the arrival time of each peak.

The challenge of estimating polarity in a global LLS may be closely tied to the challenge of measuring the arrival time. Short-range networks can simply measure the polarity of the ground wave to determine the vertical projection of the current source vector, which gives the polarity of charge lowered by the current process. However, the polarity of the first ionospheric reflection inverts after a relatively short distance (~300 km). So, if the lightning detection sensor mistakes the first reflection for the ground wave or vice-versa, the polarity will be wrong. Similarly, the polarity inverts again with the second ionospheric reflection. Thus, properly tagging the lobe of the waveform signal enables the network to determine polarity properly. Accordingly, some embodiments described herein may determine polarity of the lightning discharge based on an estimate of propagation distance of the radio wave from the lightning discharge to the lightning detection sensor, a propagation path profile of a propagation path of the radio wave, and waveform features generated by the lightning detection sensor.

In addition, using the average arrival time described herein, a proper identification of the ground wave and first reflection may be used as inputs to applying the correct arrival time offset for waveforms measured within a shorter range (~4000 km) from the lightning discharge. In particular, for a waveform having an estimated propagation distance that is within the "shorter range", the lobe may be identified as described herein (e.g., based on the average arrival time) as being the ground wave, first reflection, second reflection, or etc. and the correct arrival time offset, or correction factor, may be determined by fitting a quadratic curve to FIG. 4A or 4B for the identified lobe.

One common goal for long-range LLSs is to determine an accurate arrival time and polarity of detected lightning discharges. One approach tries to decipher the waveform shape to properly identify the waveform lobe numbers. After the lobe numbers are identified, one can 1) determine the polarity, and 2) apply an appropriate correction factor to a corresponding arrival time, such as zero-crossing or onset-corrected arrival time of the ground wave, $1^{st}$ reflection, etc., to refer the arrival time back to the speed-of-light arrival time.

Figure 7A:
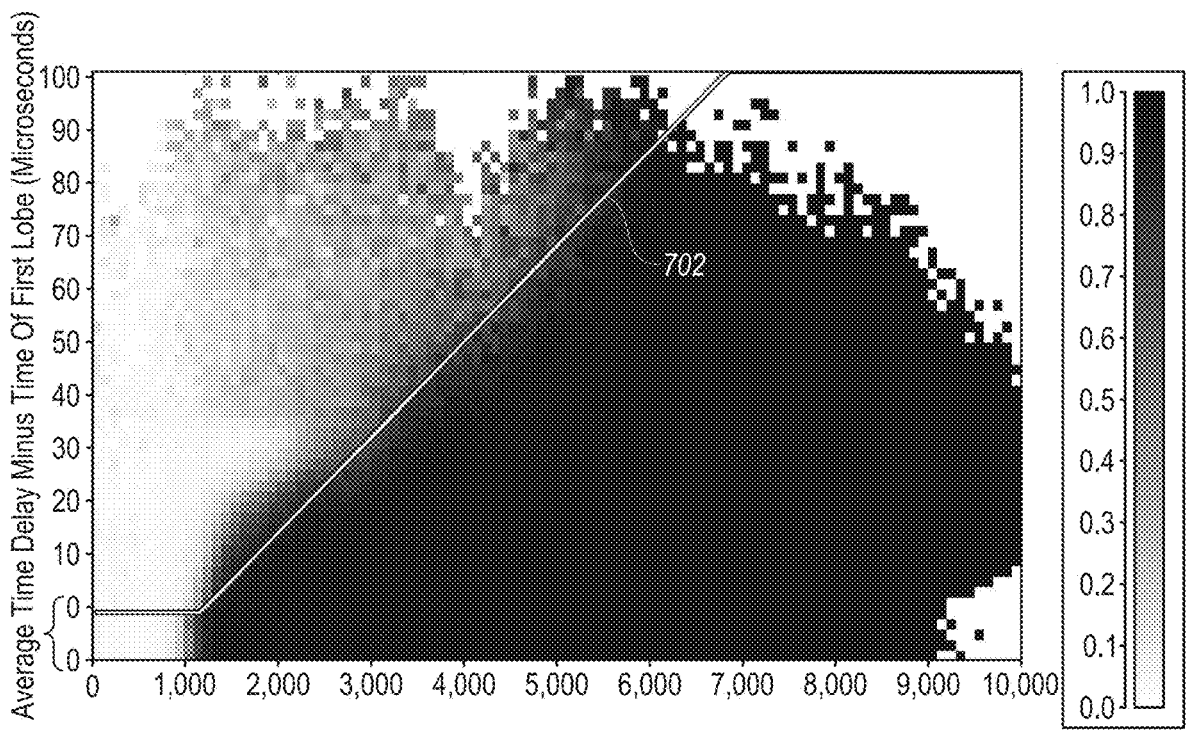
FIG. 7A is a graph of fraction of first peaks of the known lightning pulses of FIG. 4A that do not represent the ground wave, FIG. 7B includes a log density plot of the first peaks of the known lightning pulses of FIG. 4A in the same parameter space as FIG. 7A.
Figure 7B:
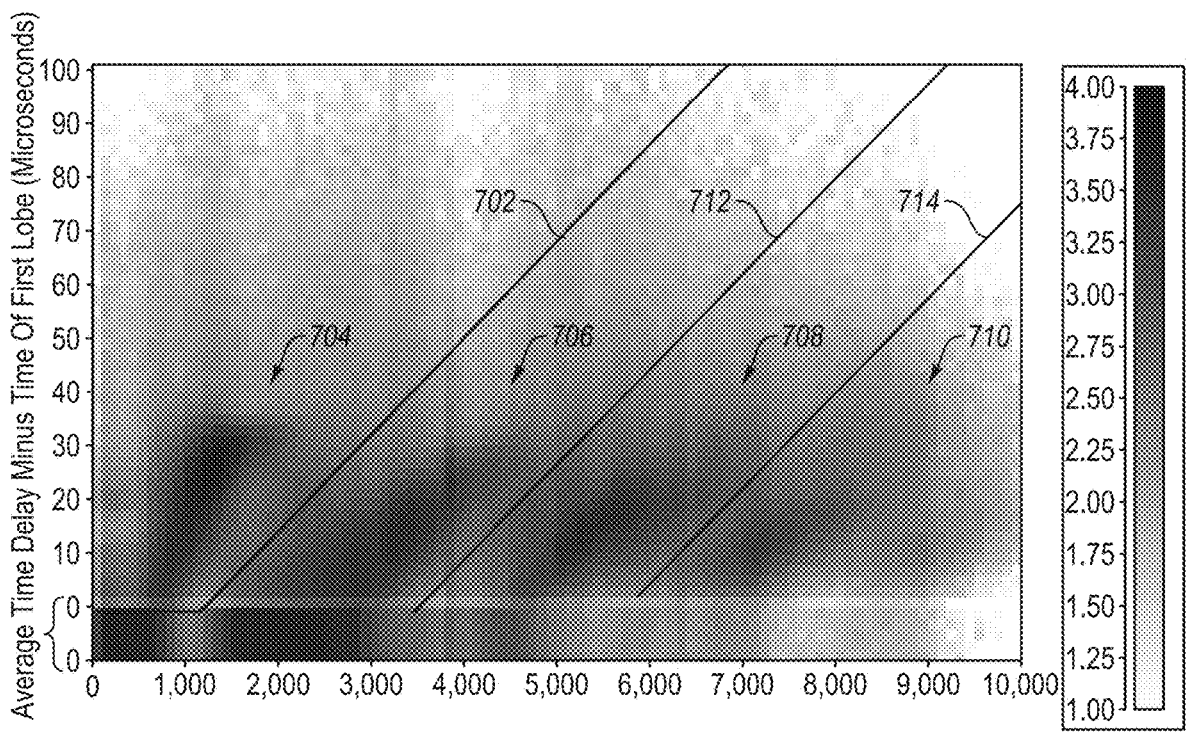

Some methods and systems may attempt to identify the lobe locally at each lightning detection sensor using sensor data generated by the lightning detection sensor, e.g., by cross-correlating waveforms with a waveform bank stored at the corresponding lightning detection sensor. Embodiments described herein alternatively or additionally consider parameters from the propagation path. In FIGS. 7A and 7B (which are described in more detail below), for example, a logistic regression to identify lobes considers two parameters from the propagation path: a difference between average arrival time $T_{ave}$ (as described elsewhere herein) and arrival time (e.g., onset-corrected arrival time) of the first detected lobe, and the propagation distance. Embodiments described herein may alternatively or additionally implement two different logistic classifiers, e.g., a daytime logistic classifier and a nighttime logistic classifier, depending on daytime vs nighttime propagation.

Embodiments described herein may determine a propagation profile for each participating or contributing lightning detection sensor, which propagation profile may include an estimated propagation distance and/or other propagation parameters that may influence the waveform shape and that may vary along the propagation path from the lightning discharge to the corresponding lightning detection sensor, using a crude geolocation calculation based on information from multiple contributing lightning detection sensors. The determination may be made centrally, e.g., at a server that communicates with each of the contributing lightning detection sensors. In an example, on a first pass, after correlating data from the contributing lightning detection sensors, the crude geolocation of a lightning discharge may be calculated using the corresponding average arrival time $T_{ave}$ of the corresponding radio wave or lightning pulse as the arrival time at each corresponding lightning detection sensor, and using a propagation speed v<c (where c is the speed of light in a vacuum) based on, e.g., an average of the day and night delays according to FIGS. 6A and 6B (which are described in more detail below). After determining an initial location based on the crude geolocation calculation, an approximate propagation path and/or estimated propagation distance from the lightning discharge may then be determined for each of the participating lightning detection sensors. This approach may result in a much more reliable propagation path estimate and/or estimated propagation distance for each of the participating lightning detection sensors than estimates of the propagation distance made locally at a given lightning detection sensor based on data detected at and by the lightning detection sensor itself according to some other systems and methods.

Figure 6A:
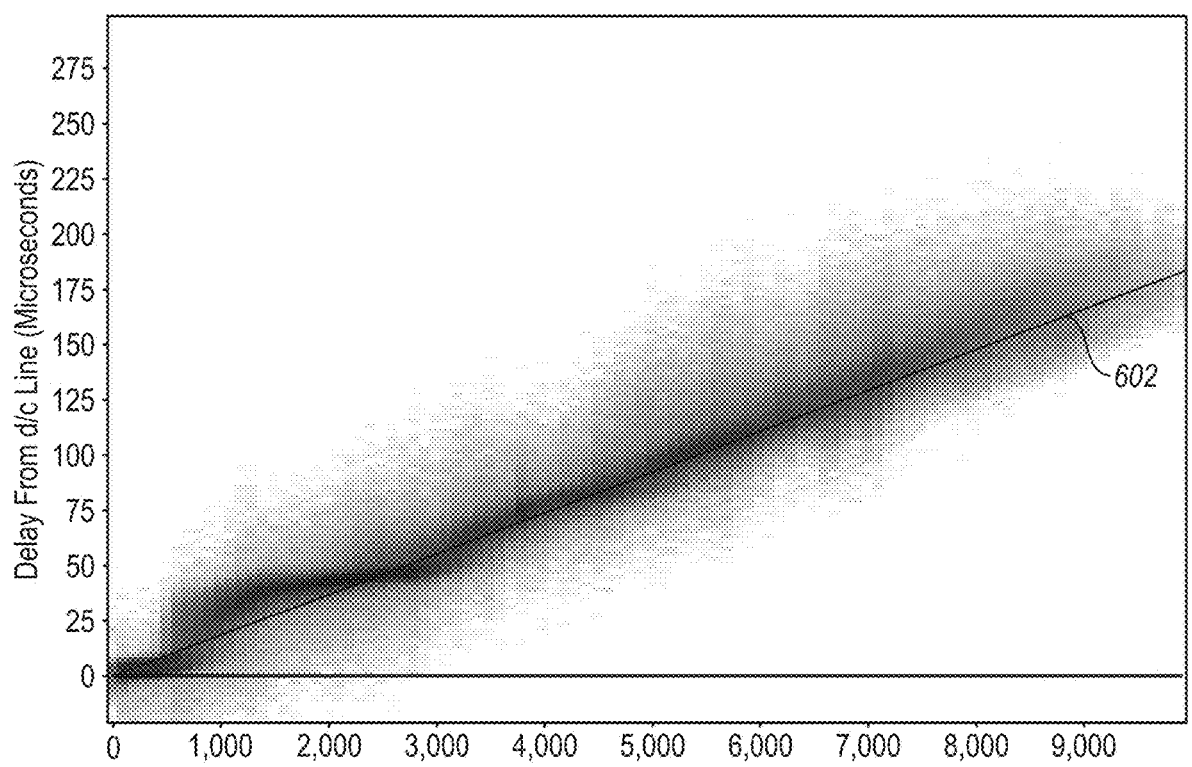
Figure 6B:
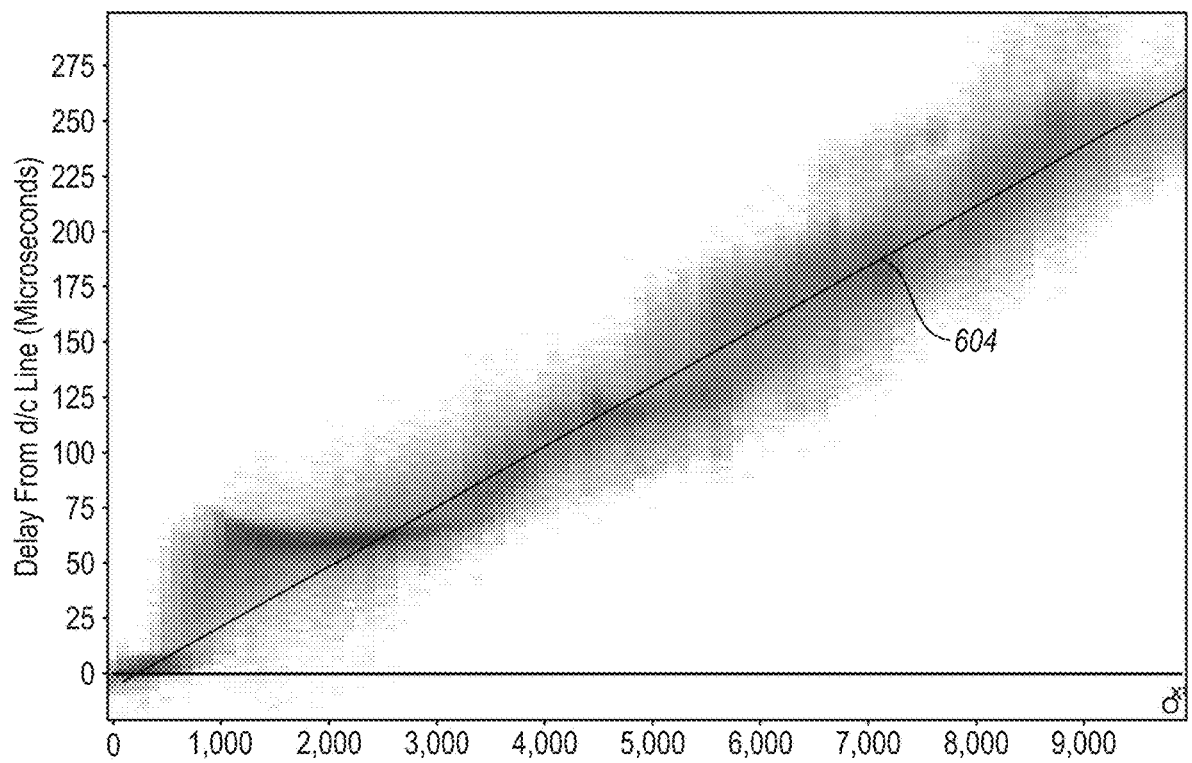

According to embodiments described herein, ionospheric profile (e.g., daytime versus nighttime) may be implemented as a parameterization, both in the context of applying a distance-dependent correction factor to the average arrival time $T_{ave}$, e.g., as described with respect to FIGS. 6A and 6B, and in the context of logistic regression classifiers for lobe identification, e.g., as described with respect to FIGS. 7A and 7B. Ionospheric profile is one of various factors or parameters that may be included in the propagation path profile to make one or more determinations (e.g., lobe identification) as described herein. Various other parameters or factors that may be included in the propagation path profile may alternatively or additionally include one or more parameters or factors as described in U.S. patent application Ser. No. 16/214,804, filed Dec. 10, 2018, which is incorporated herein by reference. In these and other embodiments, propagation may depend on a variety of additional factors, including relative propagation angle with respect to the magnetic field, geomagnetic latitude, ground conductivity, and sun elevation.

Figure 4A:
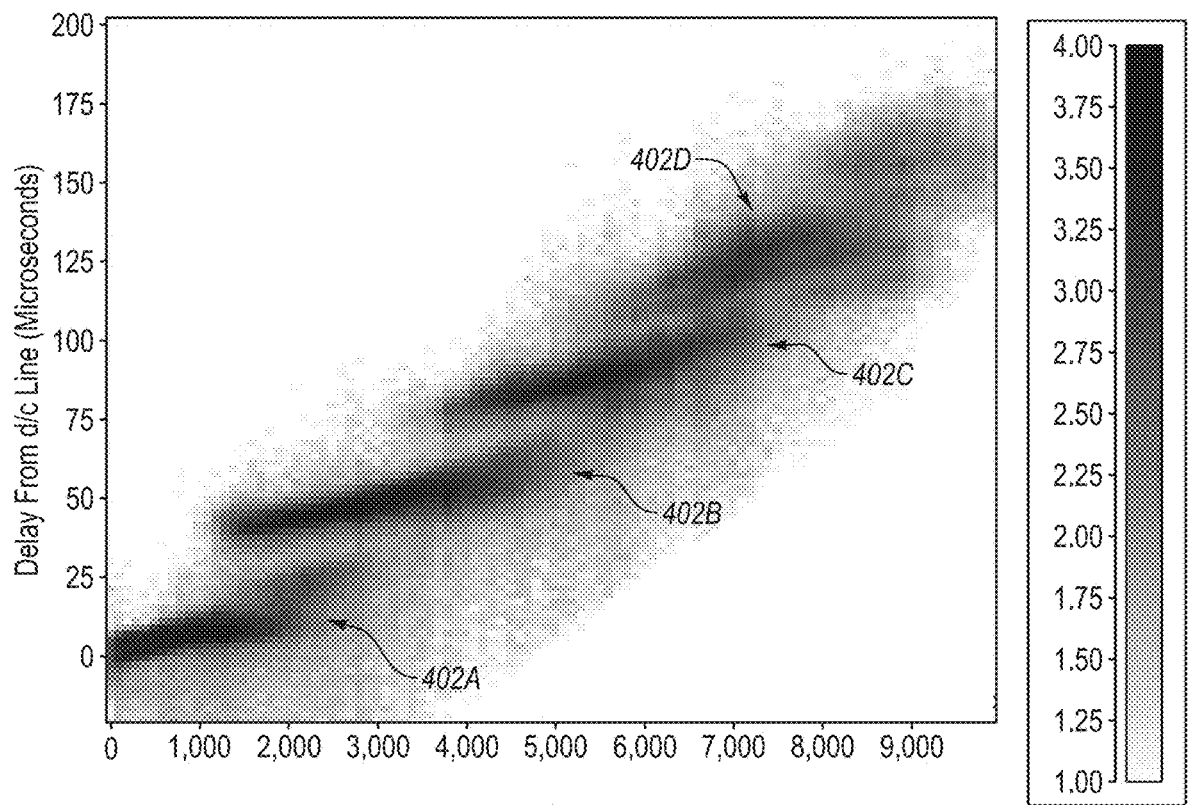
Figure 4B:
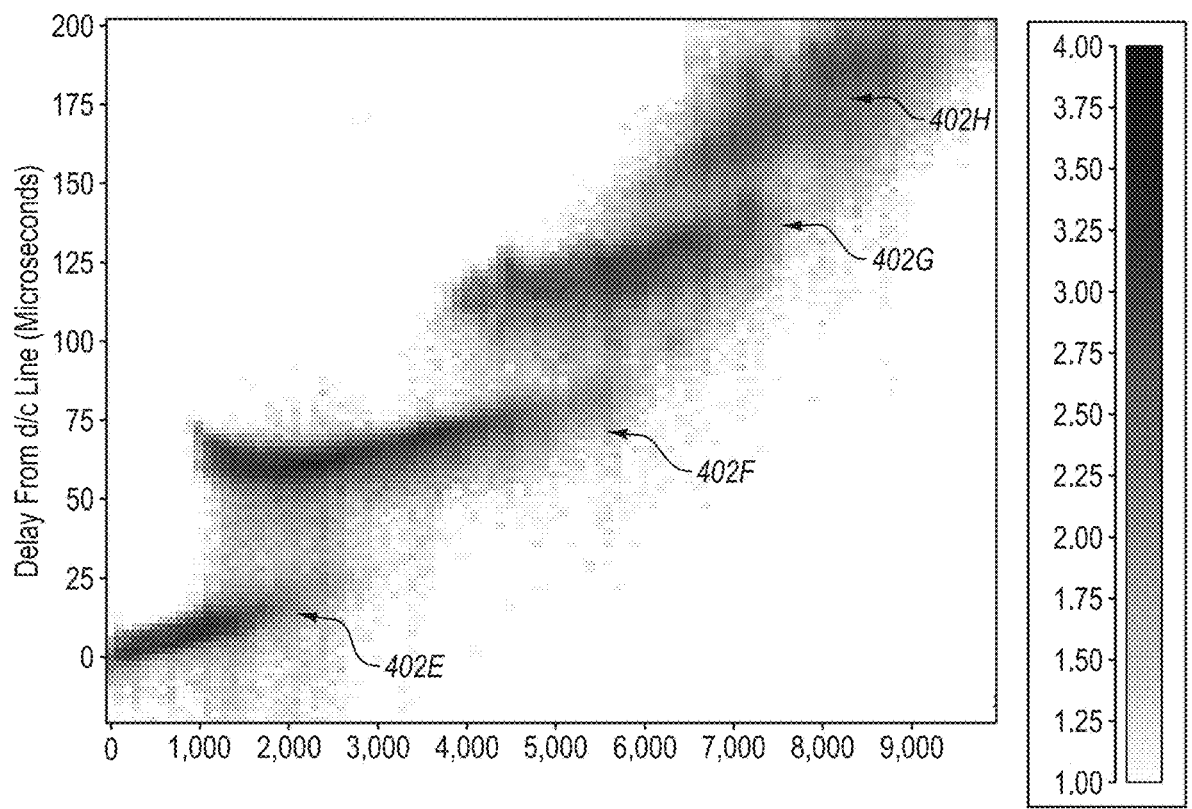

The lobe identification as determined herein may then be used to determine polarity, and/or to apply the appropriate correction factor to the arrival time to (e.g., the onset-corrected arrival time, the zero-crossing arrival time, or other suitable arrival time). These correction factors may be determined, e.g., from applying fitted curves to distributions such as shown in FIGS. 4A and 4B (which are described in more detail below).

As described herein, the average arrival time $T_{ave}$ may be used in the arrival time calculation for more distant lightning (e.g., at propagation distances greater than 4000 km) and/or as a feature—in the form of $T_{ave}-t_0$—(along with propagation distance) for the lobe identification logistic classifier.

As described in more detail below, the average arrival time $T_{ave}$ may vary smoothly with distance, so that it may be used as an arrival time measurement in cases where it may be difficult or impossible to reliably estimate the lobe number. According to some embodiments, a correction factor may be applied to the average arrival time $T_{ave}$ (to refer it back to the speed-of-light line) based on distance, parameterized by day vs night. This is shown by fit lines 602 and 604 in FIGS. 6A and 6B. For mixed day/night paths, the fit lines 602 and 604 in FIGS. 6A and 6B may be weighed based on the day/night mix. There may be one or more different or additional inputs (e.g., instead of or in addition to ionospheric profile) to the correction factor. As an example, the one or more alternative or additional inputs to the correction factor may include day vs night mix, propagation direction, geomagnetic latitude, and ground conductivity profile.

The relevance of the feature $T_{ave}-t_0$ to lobe identification will shortly be described. First, some comments about the intuition for using waveform features, along with propagation path parameters, to identify the lobe number are provided. As the radio wave propagates in the Earth-ionosphere waveguide, the radio wave shape changes. The amplitude and delay of subsequent ionospheric hops change with respect to the ground wave with distance. These changes also depend on the specifics of the propagation path. The day vs night ionospheric profile may account for the biggest difference in behavior, which is why some embodiments herein include separate logistic classifiers based on day vs night ionospheric profile. One or more additional parameters, such as latitude, or direction, may be added to either the classification and/or an additional parameterization. For example, some embodiments may include logistic classifiers for different directions under a nighttime ionosphere, logistic classifiers based on half day/half night propagation, and/or other logistic classifiers based on other parameters.

One reason the feature "$T_{ave}-t_0$", along with distance, may be relevant for lobe identification, e.g., as a feature for the logistic regression is because the average arrival time $T_{ave}$ as described herein may incorporate both the amplitude and delay of subsequent hops into its calculation. As the first detected lobe changes from the ground wave to the $1^{st}$ hop, for example, the average arrival time $T_{ave}$ parameter may vary smoothly (by design). However, to may "snap" by ~30 microseconds, so "$T_{ave}-t_0$" may present a discontinuity when the first detected lobe changes from the ground wave to the first hop. This snapping behavior accounts for separation between features 704 and 706 in FIG. 7B. The same logic applies to the separation between features 706 and 708 and between features 708 and 710 in FIG. 7B.

Other input features that capture the evolution of the waveform may be used instead of or in addition to the average arrival time $T_{ave}$, such as the relative amplitude of the first peak with the maximum peak.

Reference will now be made to the drawings to describe various aspects of some example embodiments of the disclosure. The drawings are diagrammatic and schematic representations of such example embodiments, and are not limiting of the present disclosure, nor are they necessarily drawn to scale.

FIG. 1 is an example lightning detection system 100 (hereinafter "system 100") that may be used to make arrival time determinations and/or discharge polarity determinations, arranged in accordance with at least one embodiment described herein. In general, the system 100 may include two or more lightning detection sensors 110 and 112 (hereinafter "sensors"). While two lightning detection sensors 110 and 112 are shown in FIG. 1, the system 100 is not limited to two sensors; more generally, the system 100 may include any suitable number of lightning detection sensors.

The system 100 may also include a network 104, a server 106, and/or one or more user interface devices 108. Although illustrated as discrete blocks, various blocks may be divided into additional blocks, combined into fewer blocks, or eliminated, depending on the desired implementation.

Each of the sensors 110 and 112 may include any type of Earth-based lightning detection sensor such as a VAISALA LS7002 lightning detection sensor or any other suitable lightning detection sensor. In some embodiments, one or more of the sensors 110 and 112 may include an Earth-based lightning detection sensor, such as Earth-based lightning detection sensor 200 of FIG. 2. In these and other embodiments, one or more of the sensors 110 and 112 may include one or more components of the Earth-based lightning detection sensor 200 of FIG. 2.

The sensors 110 and 112 may be distributed throughout an environmental space to generate Earth-based lightning data about one or more lightning discharges 102 within the environmental space. In some embodiments, for example, the sensors 110 and 112 may generate the Earth-based lightning data about the lightning discharge 102 within the environmental space. A single lightning discharge 102 is depicted in FIG. 1 for simplicity, however, many more lightning discharges are contemplated.

Each lightning discharge 102 may include a discharge with movement of charge in the Earth's atmosphere or between the atmosphere and Earth, and which generates or emits electromagnetic radiation (EMR) emissions that may be detected by the sensors 110 and 112. The EMR emissions may include radio frequency (RF) emissions. RF emissions may generally include EMR emissions with a frequency somewhere in a range from about 500 Hz to about 300 gigahertz (GHz). RF emissions from a lightning discharge may be referred to as lightning pulses or more generally as radio waves.

In some embodiments, the sensors 110 and 112 may detect low frequency lightning pulses emitted by the lightning discharges 102; for example, the sensors 110 and 112 may detect the lightning pulses at frequencies between 1 kHz and 400 kHz. Additionally or alternatively, the sensors 110 and 112 may detect the lightning pulses at frequencies equal to or less than 30 kHz (e.g., VLF). Additionally or alternatively, the sensors 110 and 112 may detect the lightning pulses at frequencies equal to or greater than 400 kHz (e.g., medium frequency (MF)).

In some embodiments, one or more of the sensors 110 and 112 may detect time domain, low frequency lightning pulses that may have (and/or whose data may have), for example, a specific shape, a specific time of arrival, a specific amplitude, and/or a specific direction of arrival from the one or more lightning discharges 102.

In some embodiments, the sensors 110 and 112 may generate the Earth-based lightning data for detected lightning pulses. The Earth-based lightning data, for example, may include waveform signals such as time-varying voltage or other time-varying measurements of the detected lightning pulses, times of occurrence of the lightning pulses, durations of the lightning pulses, the timing of when the lightning pulses are detected at each sensor, the peak magnitudes of the lightning pulses, the polarity of the lightning pulses, the type of lightning pulses, global positioning system (GPS) data associated with the sensors 110 and 112, angle or direction of arrival data, the time of day of arrival (e.g., daytime or nighttime), arrival times (e.g., onset-corrected arrival times, zero crossing times, or other suitable arrival times), average arrival times, data from which one or more of the foregoing may be determined or derived, or other Earth-based lightning data. The sensors 110 and 112 may send some or all of the Earth-based lightning data to the server 106.

Each lightning pulse and the corresponding waveform signal generated at each of the sensors 110 and 112 may include multiple local extrema (e.g., maxima and/or minima) over time. The local extrema may generally be referred to as peaks. Each of the peaks in each waveform signal may correspond to and/or represent a different one of the ground wave or a subsequent ionospheric reflection or "hop". The magnitude of each peak may be referred to as a peak magnitude. For a given waveform signal representing a given lightning pulse, the peak with the maximum peak magnitude compared to the peak magnitudes of the other peaks may be referred to as the maximum peak. In an example embodiment, each of the sensors 110 and 112 may determine an average arrival time of each lightning pulse based on a weighted average of arrival times, such as a weighted average of onset-corrected arrival times, of some or all of the peaks. The determination of onset-corrected arrival times according to an example embodiment is described in more detail in, e.g., Honma.

In some embodiments, the sensors 110 and 112 may detect lightning discharges 102 and/or lightning pulses emitted by the lightning discharges 102 at long ranges such as, for example, ranges greater than 500 km, 1000 km, 1500 km, 1750 km, etc.

In some embodiments, the sensors 110 and 112 may provide geolocation capabilities to the server 106 via the network 104, that specify the geolocation of the respective sensors 110 and 112.

In some embodiments, the network 104 may communicatively connect the sensors 110 and 112 to the server 106. In some embodiments, the network 104 may be a wireless network that includes one or more wireless networks, such as a wireless local area network (LAN), a cellular network, a long-term evolution (LTE) network, a code division multiple access (CDMA) network, a global system for mobile communication (GSM) network, a microwave network, a long range Wi-Fi network, a satellite network, or other suitable network. In some embodiments, the network 104 may include a wired LAN or Ethernet connection, or other wired connections for serial or parallel data transmission from the sensors 110 and 112 to the server 106. In some embodiments, the network 104 may include both wireless and wired components; for example, the sensors 110 and 112 and the server 106 may be communicatively coupled to the network 104 via one or more wired connections.

Figure 10:
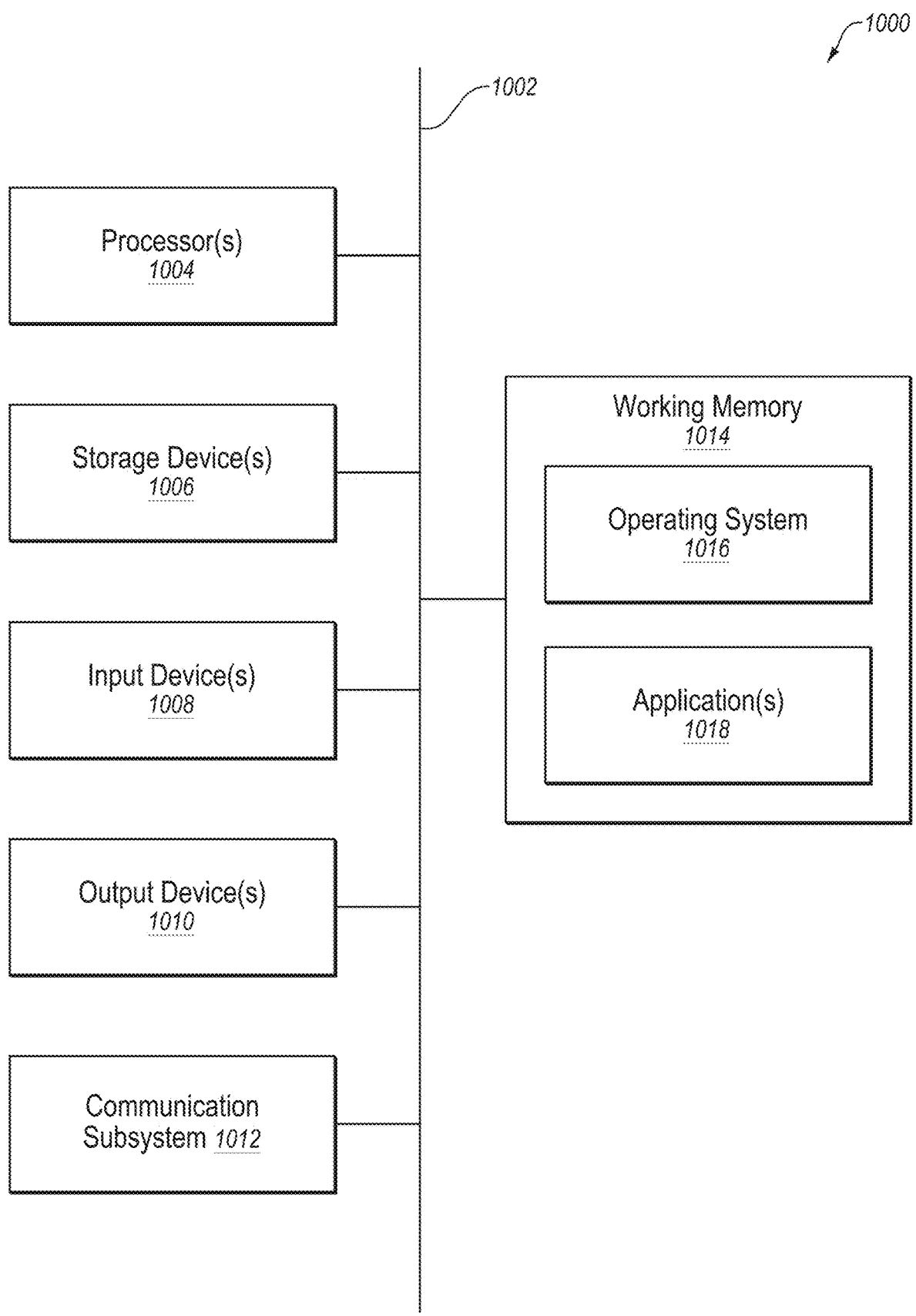

In some embodiments, the server 106 may include one or more components of a computational system 1000 of FIG. 10. In some embodiments, the server 104 may include one or more servers located in one or more locations. The server 106 may receive the lightning data from all or some of the sensors 110 and 112 via the network 104. The server 106 may include a database where the lightning data received from the sensors 110 and 112 may be stored.

In some embodiments, the server 106 may include a processor (or one or more processors) programmed to process and/or analyze the Earth-based lightning data received from the sensors 110 and 112 and/or stored in the database of the server 106.

In some embodiments, the server 106 may geolocate (e.g., determine a position of) the lightning discharges 102, or locations of origin of the corresponding lightning pulses, based on the lightning data received from the sensors 110 and 112. For example, the server 106 may be configured to determine a position of the lightning discharge 102 (e.g., using a time difference of arrival (TDOA) based on GPS-synchronized timing, or triangulation based on arrival angle data, or a combination of the two methods, based on timing, angle, and/or other waveform features included in the lightning data received from the sensors 110 and 112). Such methods may consider the time of arrival of the same lightning pulse emitted by the lightning discharge 102 at the two (or more) sensors 110 and 112, locations, angle/direction data, and/or average arrival time.

In some embodiments, the server 106 may determine the polarity of the lightning discharge 102. The polarity determination may be or include an overall or final polarity determination based on lightning data from multiple lightning detection sensors, such as the sensors 110 and 112. For example, using lightning data from each of the sensors 110 and 112, the server 106 may determine: a polarity of a corresponding first peak in the corresponding waveform signal; an estimated propagation distance of the radio wave from the lightning discharge 102 to the corresponding one of the sensors 110 and 112; a corresponding propagation path profile of a corresponding propagation path of the radio wave; whether the corresponding first peak represents a ground wave from the lightning discharge 102 or an nth ionospheric reflection of the ground wave based on the corresponding estimated propagation distance, the corresponding propagation path profile, and corresponding waveform features received from the corresponding one of the sensors 110 and 112; and a sensor-specific polarity of the lightning discharge 102 for each of the corresponding one of the sensors 110 and 112 based on the corresponding determined polarity of the first peak and the corresponding determination of whether the corresponding first peak represents the ground wave or the nth ionospheric reflection. In some embodiments, the server 106 may apply a weighted majority rule to all contributing sensor-specific polarity determinations in which an adjustable weighting factor is applied to each of the sensor-specific polarity determinations for the sensors 110 and 112.

In some embodiments, the user interface device 108 may include any device that can access data stored at the server 106 such as a computer, a laptop, a smartphone, a tablet, or other suitable device. The user interface device 108 may be used to retrieve and/or present the lightning data from sensors 110 and 112 and/or other measurements and information related to the lightning discharges 102.

Figure 2:
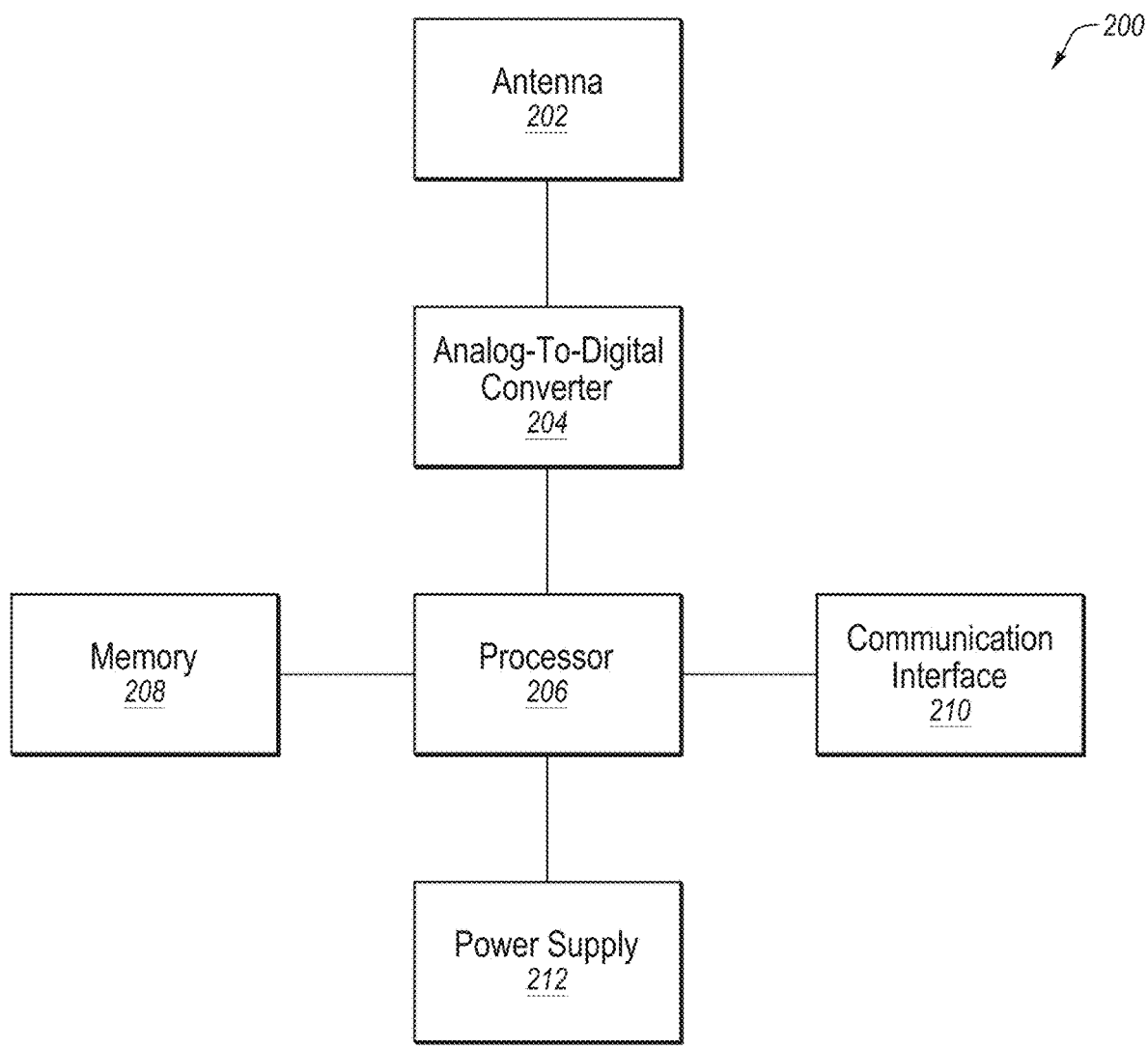
FIG. 2 is an example Earth-based lightning detection sensor that may be implemented in FIG. 1, FIG. 3 includes graphs of example waveform signals that represent a lightning pulse emitted by a lightning discharge measured at various propagation distances in the daytime, FIGS. 4A and 4B include log density plots of onset-corrected arrival times after the speed-of-light flight time of multiple known lightning pulses.

FIG. 2 is an example Earth-based lightning detection sensor 200 (hereinafter "sensor 200") that may be implemented in the system 100 of FIG. 1, arranged in accordance with at least one embodiment described herein. The sensor 200 may include or correspond to one or more of the sensors 110 and/or 112 of FIG. 1. In at least one embodiment, the sensor 200 may include an antenna 202, an analog-to-digital converter (ADC) 204, a processor 206, a memory 208, a communication interface 210, and/or a power supply 212. Various other components may also be included.

In some embodiments, the sensor 200 may, for example, detect lightning pulses emitted by lightning discharges in an environmental space and/or may measure different characteristics of the lightning-generated radio wave pulses. For example, the sensor 200 may receive and detect, at the antenna 202, lightning-generated radio wave pulses spanning one or more of the LF, VLF, and/or ELF frequency bands. LF may include frequencies in the range of 30 kHz to 300 kHz. VLF may include frequencies in the range of 3 kHz to 30 kHz. ELF may include frequencies in the range of 0.3 kHz to 3 kHz. In other embodiments, the sensor 200 may receive and detect, at the antenna 202, lightning-generated radio wave pulses at other frequencies instead of or in addition to the foregoing range of detection frequencies. For instance, the detection frequencies may extend at least partially into MF (300 kHz to 3 MHz). The antenna 202 may detect either the vertical electric field, or it may be comprised of two orthogonally oriented magnetic field antennas to detect the horizontal magnetic field. The antenna 202 may output, for each detected lightning pulse, an analog signal that represents the lightning pulse.

In some embodiments, the ADC 204 may convert the received analog signal for each lightning-generated radio wave pulse into a digital signal or digital data. The digital signal or digital data may include a digital representation of the lightning pulse. The digital signal or digital data, for example, may be stored by the processor 206 in the memory 208. The digital signal or digital data, for example, may be communicated to an external device, such as the server 106, via the communication interface 210, as lightning data. The analog signal output by the antenna 202 and/or the digital signal or digital data output by the ADC 204 may include or correspond to the waveform signal described herein.

In some embodiments, the processor 206 may include one or more components of the computational system 500. In some embodiments, the processor 206 may include one or more servers located in one or more locations and/or located at various distributed locations. In one embodiment, processing to extract waveform features may be done locally at any of the sensors described, where the waveform features may be transmitted to a different computing system for further analysis and/or collection, for example, to the server 106 of FIG. 1. Thus, some processing may be performed locally while some processing may be performed remotely. The processor 206 may more generally include any suitable processor device, such as a processor, a microprocessor, a controller, a microcontroller, a field programmable gate array (FPGA), an application specific integrated circuit (ASIC), a digital signal processor (DSP), or other suitable processing device.

In general, the memory 208 may include computer storage media such as one or more of a disk drive, a drive array, an optical storage device, a solid-state storage device, such as random access memory ("RAM") and/or read-only memory ("ROM"), which can be programmable, flash-updateable, and/or the like.

In some embodiments, the communication interface 210 may include a modem, a network card (wireless or wired), an infrared communication device, a wireless communication device, and/or a wireless communication chipset. In some embodiments, the communication interface 210 may communicate with a wireless network such as a wireless LAN, a cellular network, a LTE network, a CDMA network, a GSM network, a microwave network, a long range Wi-Fi network, a satellite network, or other suitable network. The communication interface 210 may transmit data, such as lightning data, to the server 106 (or another device) via the network 135 (or other network).

In some embodiments, the sensor 200 may be mounted on a concrete ground pad, while in other embodiments, the sensor 200 may also include non-ground mounting options. The sensor 200 may be used to perform and/or control operation of one or more of the methods or operations of the embodiments described herein. For example, the sensor 200 may be used to make any measurement, perform any calculation, solve any equation, perform any identification, and/or make any determination described herein.

In some embodiments, the sensor 200 may include a power supply 212. The power supply 212 may be a DC power supply or an AC power supply.

The antenna 202 may be configured to detect the electric field component or signal, which may be referred to as "E", or the magnetic field components or signals in two orthogonal directions "x" and "y", which magnetic field components or signals may be referred to as "$M_x$" and "$M_y$". Alternatively or additionally, the sensor 200 may include two antennas 202, e.g., one antenna 202 to detect E and a crossed loop antenna 202 to detect $M_x$ and $M_y$. The analog signal output by the ADC 204 and/or the digital signal or data output by the processor that is representative of the signal E, $M_x$, or $M_y$, may nevertheless be referred to as the waveform signal.

Given the existence of the magnetic signals, it is not essential to also detect and measure the electric signal E. However, it may be useful to utilize all three signals to allow for the resolution of possible ambiguities. Moreover, any one of the signals E, $M_x$, and $M_y$ may be used as a proxy for the lightning pulse emitted by the lightning discharge, and may be referred to herein as a signal "K" for generality. The signal K used for purposes described herein may include the signal with the highest signal-to-noise ratio. The magnetic signals $M_x$ and $M_y$ are typically used for this reason. Where the magnetic signals are used, a combination of the $M_x$ and $M_y$ signals may be used, such as the magnitude $(M_x^2 + M_y^2)^{1/2}$; however, this refinement will be ignored for purposes herein.

As previously indicated, the lightning pulse or radio wave emitted by a lightning discharge initially has a waveshape, polarity, and amplitude, and all of these characteristics of the radio wave change as the radio wave propagates. As a result of interaction of the radio wave with the surface of the earth and the ionosphere, by degrees as a function of the distance traveled, the radio wave becomes attenuated and more complex, and the polarity changes. The radio wave interacts with the earth differently over land than water, and interacts differently with the ionosphere depending on whether it is day or night and on location and propagation direction. In some time of arrival (TOA) measurements, it is not possible to know that a particular point on the radio wave as it is initially produced maps or corresponds to a particular point on the radio wave as it is received, guaranteeing significant TOA measurement errors. It is likewise not possible to know how polarity as perceived at the sensor corresponds to initial polarity. So it is a severe drawback of prior art long-range lightning detection systems and methods that the emitted wave degrades over long distances to a point where it does not provide sufficient intelligible information about the original lightning strike to characterize the strike as desired.

Figure 3:
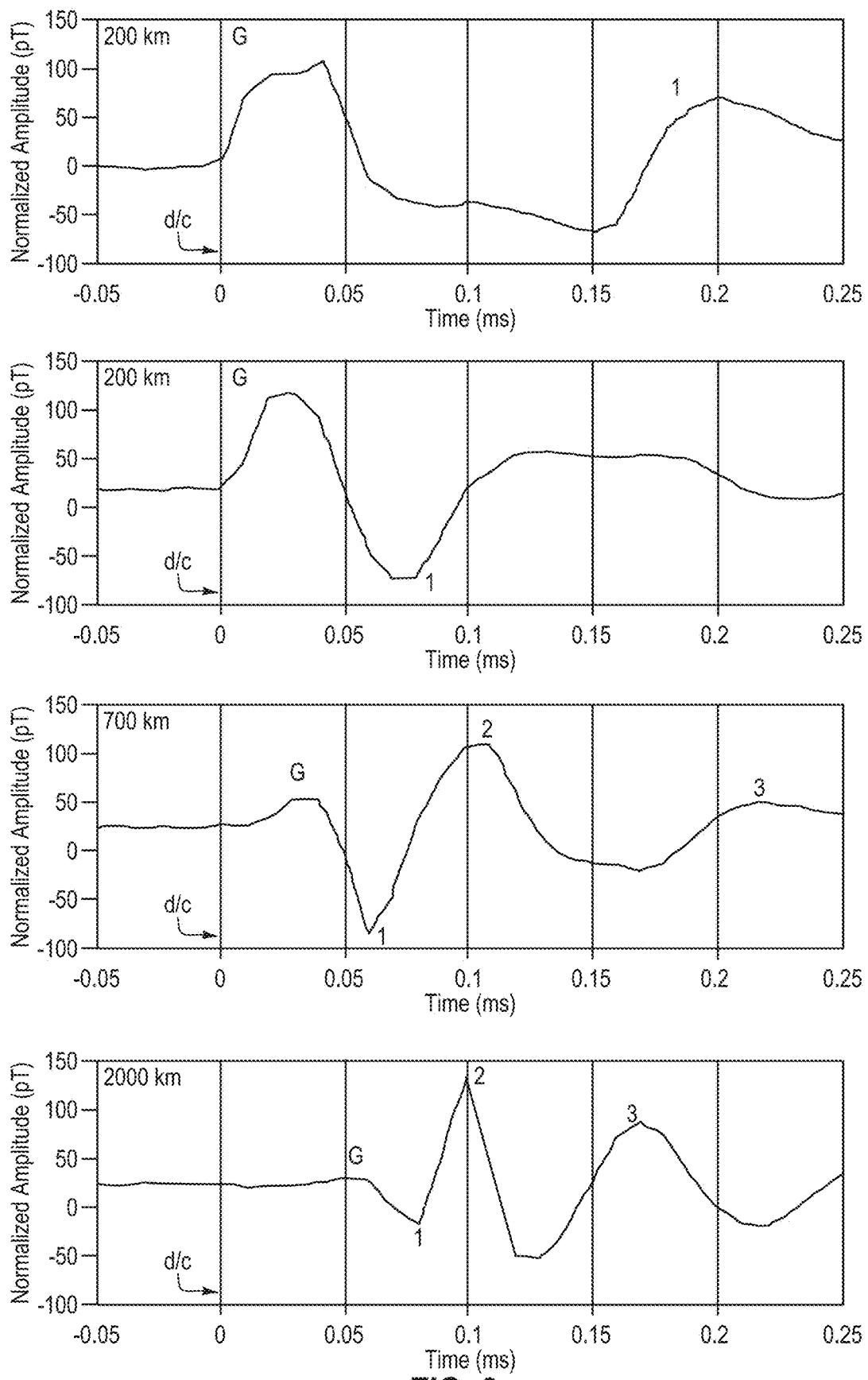

FIG. 3 includes graphs of example waveform signals that represent a lightning pulse emitted by a lightning discharge measured at various propagation distances in the daytime, arranged in accordance with at least one embodiment described herein. The propagation distances are identified at the top left of each graph and include propagation distances of, respectively, 200 km, 700 km, 2000 km, and 4400 km. The waveform signals are generally characteristic of the evolution of lightning pulses, e.g., signals K, over distance, with the understanding that the evolution may vary depending on the nature of the propagation path and other factors.

Each of the waveform signals in FIG. 3 has a peak labeled "G" (for "ground wave") which represents the ground wave of the lightning pulse and a peak labeled "1" which represents a first ionospheric reflection of the ground wave. At distances of 2000 km and 4400 km, each of the waveform signals additionally has a peak labeled "2" which represents a second ionospheric reflection of the ground wave and a peak labeled "3" which represents a third ionospheric reflection of the ground wave. As can be seen, the amplitude corresponding to the "G" peak decays with distance, but the reflected peak "1" increases in amplitude relative to the "G" peak with distance.

A line "d/c" is shown in each of the graphs for which the time is taken as being zero, where "d" is the (great circle) distance from the strike to the sensor at which the waveform is or would be received, and "c" is the speed of light. This line accounts for the propagation time that occurs simply as a result of the distance traveled, referred to as speed of light propagation. By "normalizing" the signals to this line, the differences in time that one expects simply as a result of a signal propagating over a smooth, perfectly conducting surface, over the various distances, are accounted for.

However, the surface and atmospheric conditions affect propagation time to extend it beyond the line d/c, defining a "delay" relative to propagation on a smooth, perfectly conducting surface. Such delays can be seen in the graphs of FIG. 3 by comparing the locations (along the time axis) of the peaks of the signals. For example, by comparing the graphs for 700 km and 2000 km, it can be seen that the onset of the G peak is delayed as a result of the signals propagating a longer distance. On the other hand, the Figures show progressive advancement of the 1 peak toward the d/c line and increase in amplitude relative to the G peak with increasing propagation distance (corresponding to decreasingly positive delays) over at least some range of distances. The 2 peak similarly progresses towards the d/c line and increases in amplitude relative to the 1 peak and the G peak with increasing propagation distance. The 3 peak similarly progresses towards the d/c line and increases in amplitude relative to the 2 peak, the 1 peak, and the G peak with increasing propagation distance. Accordingly, depending on the detection threshold set at each lightning detection sensor and the propagation distance from any given lightning discharge, it may be difficult for the lightning detection sensors to determine whether the first peak detected is a G peak, a 1 peak, a 2 peak, a 3 peak, or other ionospheric reflection.

FIGS. 4A and 4B include log density plots of onset-corrected arrival times after the speed-of-light flight time, arranged in accordance with at least one embodiment described herein. In more detail, the plotted onset-corrected arrival times are for the first (e.g., earliest) peak of each of multiple known lightning pulses where the first peak has a peak magnitude greater than 0.35 of the maximum peak magnitude of the lightning pulse. FIG. 4A is for daytime propagation, while FIG. 4B is for nighttime propagation. In each of FIGS. 4A and 4B, the vertical y axis is microseconds after the speed-of-light flight time (where the speed-of-light flight time is at y=0), and the horizontal x axis is propagation distance in km from the lightning discharge to the corresponding lightning detection sensor.

Each of FIGS. 4A and 4B includes multiple clusters or lobes 402A-402H of events (collectively "lobes 402" or generically "lobe 402" or "lobes 402"). The lobes 402A, 402E arriving within about 20 microseconds of the speed-of-light flight time represent the ground wave. The lobes 402B, 402F arriving within about 40 microseconds of the speed-of-light flight time under the daytime ionosphere (FIG. 4A) or within about 60 microseconds of the speed-of-light flight time under the nighttime ionosphere (FIG. 4B) represent the first ionospheric reflection of the ground wave. The lobes 402C, 402G arriving within about 80 microseconds of the speed-of-light flight time under the daytime ionosphere (FIG. 4A) or within about 120 microseconds of the speed-of-light flight time under the nighttime ionosphere (FIG. 4B) represent the second ionospheric reflection of the ground wave. The lobes 402D, 402H arriving within about 120 microseconds of the speed-of-light flight time under the daytime ionosphere (FIG. 4A) or within about 150 microseconds of the speed-of-light flight time under the nighttime ionosphere (FIG. 4B) represent the third ionospheric reflection of the ground wave.

The information derived from the known lightning pulses as illustrated in FIGS. 4A and 4B can be leveraged to determine the speed-of-light flight time of new lightning pulses if the first peak is correctly tagged, e.g., correctly identified as being either the ground wave peak, the first ionospheric reflection peak, or subsequent ionospheric reflection peak. For example, if the first peak of a new lightning pulse under a daytime ionosphere is correctly tagged as the ground wave peak, a correction factor of about 10 microseconds may be subtracted from the onset-corrected arrival time to refer the arrival time back to speed-of-light propagation. As another example, if the first peak of a new lightning pulse under a daytime ionosphere is correctly tagged as the first ionospheric reflection peak, a correction factor of about 40 microseconds may be subtracted from the onset-corrected arrival time to refer the arrival time back to speed-of-light propagation.

As long as the first peak is correctly identified, a quadratic curve can be fitted to these collections to recover an arrival time uncertainty on the order of several microseconds, but if the first peak is incorrectly identified, the arrival time uncertainty grows to many 10's of microseconds. At longer ranges, correct identification of the first peak becomes more challenging. Some embodiments described herein relate to a method to determine the arrival time and/or offset correction (or correction factor) that does not depend on proper identification of the first peak. Some other embodiments described herein may identify the first peak or lobe, e.g., as being the ground wave, first reflection, second reflection, or etc. based on, e.g., the average arrival time $T_{ave}$ or other features as described herein and may alternatively use the fitted curve approach based on the identified first peak or lobe to determine the arrival time and/or offset correction (or correction factor).

In general, the example method to determine the arrival time that does not depend on proper identification of the first peak may take a weighted average of some or all of the peaks in a waveform signal representing a lightning pulse. The onset-corrected arrival time (or other arrival time measurement) of each of at least some of the peaks may be weighted by a relative magnitude jump from the previous peak. According to an example embodiment, the method to determine the arrival time may include determining an average arrival time according to equation 1:

$$T_{ave} = \frac{1}{1-C} \sum_{i=1}^{M} t_i \left( \frac{|A_i| - |A_{i-1}|}{|A_{peak}|} \right) \quad \text{(equation 1)}$$

In equation 1, $T_{ave}$ is the average arrival time of the lightning pulse. C is a constant between 0 and 1. In an example, C may be 0.35 or other constant between 0 and 1. $|A_{peak}|$ is the peak magnitude of the maximum peak from among all of the peaks of the waveform signal, and may be referred to as the maximum peak magnitude since it is greater than the peak magnitudes of all of the other peaks of the waveform signal. M is a number of the peaks that (1) each has a peak magnitude that exceeds a threshold $C*|A_{peak}|$ and (2) that each has a corresponding onset-corrected arrival time that is less than (e.g., earlier than) or equal to the onset-corrected time of the maximum peak. i is an integer from 1 to M. $|A_i|$ is the peak magnitude of the ith peak from among the M peaks that satisfy conditions (1) and (2). $t_i$ is the onset-corrected time of the ith peak. $A_0$ is equal to $C*|A_{peak}|$. A specific example is described with respect to FIGS. 5A and 5B.

Figure 5A:
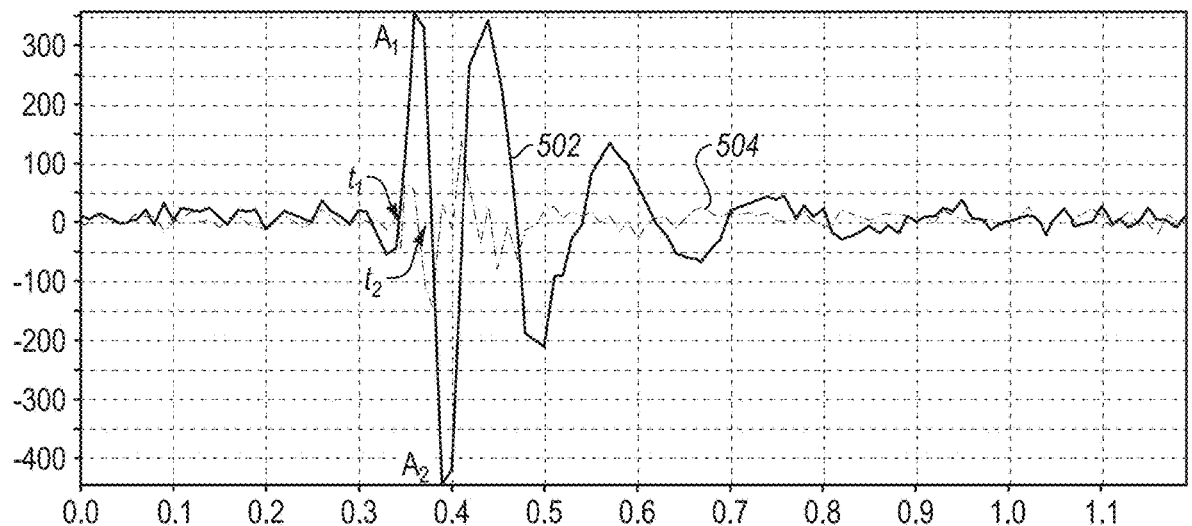
FIG. 5A is a graph of an example waveform signal that represents a detected lightning pulse.
Figure 5B:
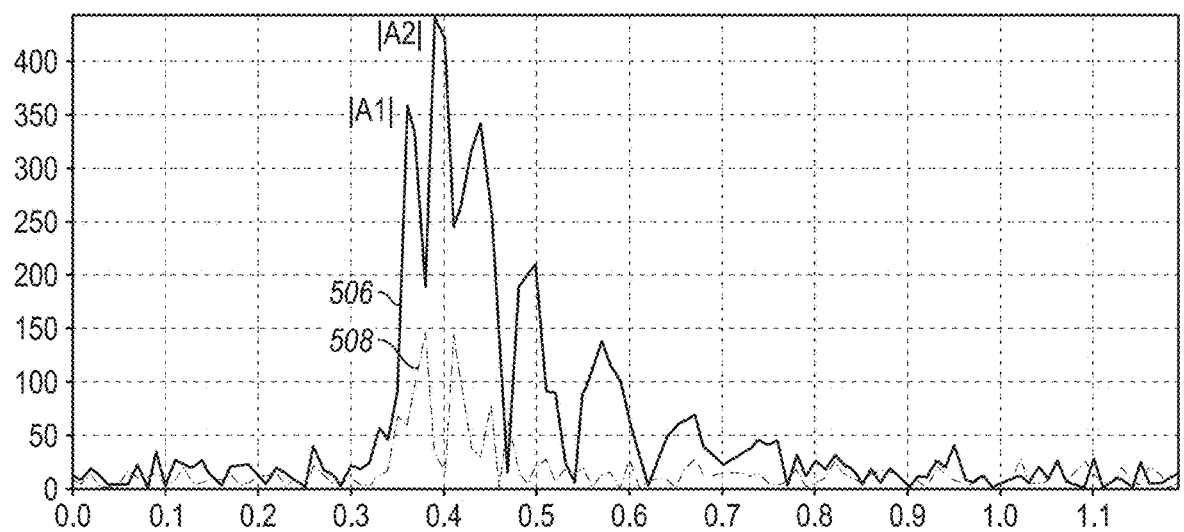
FIG. 5B is a graph of a rectified waveform signal corresponding to the waveform signal of FIG. 5A, FIGS. 6A and 6B include log density plots of average arrival times of the known lightning pulses of FIGS. 4A and 4B.

FIG. 5A is a graph of an example waveform signal that represents a detected lightning pulse, arranged in accordance with at least one embodiment described herein. FIG. 5B is a graph of a rectified waveform signal corresponding to the waveform signal of FIG. 5A, e.g., the absolute value of the waveform signal of FIG. 5A, arranged in accordance with at least one embodiment described herein. In FIGS. 5A and 5B, the horizontal x axis is time in milliseconds and the vertical y axis is proportional to voltage in volts and may be, e.g., picoteslas or other suitable units.

In FIG. 5A, the waveform signal has been digitally rotated along the arrival angle to align most of the energy in the received radio wave along a first virtual channel, depicted by a first trace 502. A second trace 504 is a second virtual channel that is 90 degrees from the first. Thus, the first trace 502 has higher signal-to-noise ratio (SNR) than the second trace 504.

In FIG. 5B, a third trace 506 is the absolute value of the first trace 502 of FIG. 5A, while a fourth trace 508 is the absolute value of the second trace 504 of FIG. 5A.

The waveform signal of FIG. 5A includes various peaks, two of which are labeled as $A_1$ and $A_2$, respectively. Other peaks are illustrated in FIG. 5A but are not labeled. The magnitudes of the peaks $A_1$ and $A_2$ are labeled $|A_1|$ and $|A_2|$, respectively, in FIG. 5B. Each of the peaks $A_1$ and $A_2$ has an onset-corrected arrival time, labeled as $t_1$ and $t_2$, respectively. The other peaks in FIG. 5A similarly have onset-corrected arrival times, which are not labeled in FIG. 5A.

In general, the method of determining the arrival time of the lightning pulse from which the waveform signal of FIG. 5A was generated may include determining peak magnitudes of each of the peaks of the waveform signal. The method may also include determining the peak with the maximum peak magnitude, which peak may be referred to as the maximum peak. In this example, the maximum peak is the peak $A_2$ and the maximum peak magnitude is $|A_2|$.

The method may also include determining and/or identifying some or all of the peaks in the waveform signal that have a magnitude greater than $C*|A_{peak}|$ for use in determining the average arrival time. In some embodiments, the method may only determine and/or identify the peaks that precede the maximum peak and that have a magnitude greater than $C*|A_{peak}|$. As previously mentioned, the constant C may be 0.35 or other constant between 0 and 1. The use of 0.35 as the value of C is somewhat arbitrary. The value of 0.35 for the constant C may be used to balance reasonable SNR against detecting enough peaks for a smoothly varying measurement of average arrival time with distance.

The method may also include determining and/or identifying an onset-corrected arrival time for each of one or more of the peaks of the waveform signal, including the onset-corrected arrival time for at least the maximum peak. In some embodiments, the method may specifically determine and/or identify a corresponding onset-corrected arrival time for each of two or more of the peaks, where the two or more of the peaks include the maximum peak and at least one peak that precedes the maximum peak and that has a magnitude greater than $C*|A_{peak}|$.

Accordingly, the average arrival time $T_{ave}$ of the lightning pulse represented by the waveform signal of FIG. 5A may be determined according to equation 1 as follows if the constant C=0.35:

$$T_{ave} = t_1 * \left( \frac{|A_1| - 0.35|A_2|}{0.65 * A_2} \right) + t_2 * \left( \frac{|A_2| - |A_1|}{0.65 * A_2} \right)$$

In the example of FIG. 5A, taking $t_1$=0.345 milliseconds (ms), $|A_1|$=362, $t_2$=0.375 ms, $|A_2|$=450, the average arrival time $T_{ave}$ of the lightning pulse represented by the waveform signal of FIG. 5A may therefore be determined as:

$$T_{ave} = 0.345 * \left(\frac{362 - 0.35 * 450}{0.65 * 450}\right) + 0.375 * \left(\frac{450 - 362}{0.65 * 450}\right) =$$

$$0.241 + 0.113 = 0.354 \text{ ms}$$

Consider another example at close range where the ground wave peak G is the maximum peak as in the first graph of FIG. 3 at 200 km. In this example, there are no peaks that precede the ground wave peak G and that have a magnitude of at least C * the magnitude of the ground wave peak G. Thus, application of equation 1 in this example determines the average arrival time $T_{ave}$ is equal to the onset-corrected arrival time of the ground wave peak since no other peaks besides the ground wave peak contribute to the summation of equation 1.

FIGS. 6A and 6B include log density plots of average arrival times of the known lightning pulses of FIGS. 4A and 4B, arranged in accordance with at least one embodiment described herein. In more detail, the plotted average arrival times are for the same known lightning pulses used for FIGS. 4A and 4B, the plotted average arrival times calculated according to equation 1. FIG. 6A is for daytime propagation, while FIG. 6B is for nighttime propagation. In each of FIGS. 6A and 6B, the vertical y axis is microseconds after the speed-of-light flight time (where the speed-of-light flight time is at y=0), and the horizontal x axis is propagation distance in km from the lightning discharge to the corresponding lightning detection sensor. FIGS. 6A and 6B additionally include fit lines 602 and 604, respectively, to remove the delay according to a best-fit subluminal group velocity.

In FIGS. 6A and 6B, the distribution of arrival times follows the fit line 602 and 604, respectively, and is generally not discretized according to the arrival lobe beyond about 3,000 km. As can be seen from a comparison of FIGS. 6A and 6B, the clustering is tighter under a daytime ionosphere (FIG. 6A) than under a nighttime ionosphere (FIG. 6B) since the daytime ionosphere has a lower effective reflection height at VLF and the ionospheric reflection properties under the daytime ionosphere are generally more lossy and stable than under the nighttime ionosphere.

The information derived from the average arrival times of the known lightning pulses as illustrated in FIGS. 6A and 6B can be leveraged to determine the speed-of-light flight time of new lightning pulses without correctly tagging, or without tagging at all, the first peak. In particular, using an estimated propagation distance (e.g., based on a crude geolocation calculation) for a new lightning pulse, a corresponding correction factor determined from FIG. 6A or 6B may be subtracted from the average arrival time of the new lightning pulse to determine the speed-of-light flight time of the new lightning pulse. For example, if the estimated propagation distance for a new lightning pulse under a daytime ionosphere (FIG. 6A) is 4,000 km, a corresponding correction factor of about 75 microseconds may be subtracted from the average arrival time of the new lightning pulse to determine the speed-of-light flight time of the new lightning pulse. If the estimated propagation distance is less than about 4,000 km the first peak may be correctly determined, e.g., using embodiments described herein, such that, instead of the foregoing, the correction factor may be determined using the fitted curve approach based on FIG. 4A and/or FIG. 4B.

Some embodiments described herein alternatively or additionally relate to a method to determine polarity of a lightning discharge. In general, the method may consider multiple input waveform features and determine the lobe of the first peak of the waveform signal that represents a lightning pulse emitted by the lightning discharge. In particular, the method may determine whether the first peak, e.g., the first peak with a peak magnitude above $C*|A_{peak}|$, corresponds to the ground wave or a particular subsequent ionospheric reflection of the lightning pulse. In an example embodiment that will be described in more detail with respect to FIGS. 7A and 7B, various input features may be used to determine the lobe of the first peak, including, e.g.: (1) propagation path profile of a propagation path of the lightning pulse from the lightning discharge to a lightning detection sensor that detects the lightning pulse, (2) delay of average arrival time of the lightning pulse as determined according to equation 1 with respect to onset-corrected arrival time of the first peak, and (3) an estimated propagation distance of the lightning pulse from the lightning discharge to the lightning detection sensor. The propagation path profile may indicate whether the propagation path has a daytime ionospheric profile, a nighttime ionospheric profile, or a mix thereof; a relative propagation angle with respect to the magnetic field; geometric latitude of some or all of the propagation path; ground conductivity for some or all of the propagation path; sun elevation for some or all of the propagation path; and/or other factor(s). In some embodiments, propagation paths that cross the day/night terminator may have weighted logistic regression coefficients based on the fraction over day and night. Embodiments described herein may be generalized, with a set of logistic regression coefficients parameterized by as many propagation profiles as desired (e.g., separating day/night by propagation direction and/or geomagnetic latitude).

After the lobe of the first peak is determined, the polarity of the lightning discharge may be determined based on the determined lobe and a polarity of the first peak. For example, if the determined lobe of the first peak is the ground wave or an even ionospheric reflection, the polarity of the lightning discharge may be determined as the polarity of the first peak. On the other hand, if the determined lobe of the first peak is an odd ionospheric reflection, the polarity of the lightning discharge may be determined as the negative of the polarity of the first peak.

The foregoing may be used to determine the polarity of the lightning discharge based on waveform features from a corresponding lightning detection sensor, which polarity determination may be referred to as a sensor-specific polarity determination. Each sensor-specific polarity determination may be based on waveform features generated by the corresponding lightning detection sensor combined with the estimated propagation distance to the corresponding lightning detection sensor. The estimated propagation distance may be determined by and/or in the network (e.g., by the server 106 of FIG. 1) based on, e.g., information from multiple lightning detection sensors.

The sensor-specific polarity determinations may be made by, e.g., a remote processor or computer, such as the server 106 of FIG. 1. An overall or final polarity of the lightning discharge may be determined based on multiple sensor-specific polarity determinations of the same lightning discharge made for multiple lightning detection sensors. The overall or final polarity determination may consider a weighted majority rule, as described in more detail below.

FIG. 7A is a graph of fraction of first peaks of the known lightning pulses of FIG. 4A that do not represent the ground wave, arranged in accordance with at least one embodiment described herein. FIG. 7A is on a grid indexed by the delay of the average arrival time determined according to equation 1 after the onset-corrected arrival time of the first peak on the y axis (in microseconds) and the estimated propagation distance (e.g., based on a crude geolocation calculation) on the x axis (in kilometers) under a daytime ionosphere. Although not illustrated, a similar graph may be generated for the nighttime ionosphere.

FIG. 7A includes a decision boundary 702 between first peaks that represent the ground wave (see all data above the decision boundary 702) and first peaks that represent a subsequent ionospheric reflection of the ground wave (see all data below the decision boundary 702).

Consider two examples. If a lightning pulse has an estimated propagation distance of 3,000 km under daytime ionosphere and the delay of the average arrival time determined according to equation 1 after the onset-corrected arrival time of the first peak of the new lightning pulse is 80 microseconds, the first peak may be determined to represent the ground wave since the point (3,000, 80) in FIG. 7A is above the decision boundary 702. As another example, if a lightning pulse has an estimated propagation distance of 3,000 km under daytime ionosphere and the delay of the average arrival time determined according to equation 1 after the onset-corrected arrival time of the first peak of the new lightning pulse is 10 microseconds, the first peak may be determined to not represent the ground wave since the point (3,000, 10) in FIG. 7A is below the decision boundary 702. Thus, embodiments described herein may implement a logistic classifier or neural network based on FIG. 7A to determine whether the first peak of a given lightning pulse represents the ground wave or a subsequent ionospheric reflection.

FIG. 7B includes a log density plot of the first peaks of the known lightning pulses of FIG. 4A in the same parameter space as FIG. 7A, arranged in accordance with at least one embodiment described herein. FIG. 7B includes various lobes 704, 706, 708, and 710, which correspond, respectively, to the ground wave, the first ionospheric reflection, the second ionospheric reflection, and the third ionospheric reflection. The lobes 704, 706, 708, and 710 may for simplicity be referred to as, respectively, the ground wave 704, the first ionospheric reflection 706, the second ionospheric reflection 708, and the third ionospheric reflection 710. There is an inclined gap beginning at about x=1,000 km and y=0 microseconds that separates the ground wave 704 from the first ionospheric reflection 706. There is another inclined gap beginning at about x=3,500 km and y=0 microseconds that separates the first ionospheric reflection 706 from the second ionospheric reflection 708. There is another inclined gap beginning at about x=6,000 km and y=0 microseconds that separates the second ionospheric reflection 708 from the third ionospheric reflection 710.

Accordingly, if it is determined that the first peak represents a subsequent ionospheric reflection rather than the ground wave, e.g., using a logistic classifier or neural network based on FIG. 7A and/or the decision boundary 702, it can then be determined whether the first peak represents the first ionospheric reflection or a particular subsequent ionospheric reflection using one or more other graphs similar to FIG. 7A and/or decision boundaries 712, 714. The decision boundaries 712, 714 may be determined, e.g., using graphs similar to FIG. 7A, to designate the boundaries between adjacent lobes. In particular, the decision boundary 712 may designate the boundary between the first ionospheric reflection 706 and the second ionospheric reflection 708, while the decision boundary 714 may designate the boundary between the second ionospheric reflection 708 and the third ionospheric reflection 710. Other logistic classifiers or neural networks based on, e.g., the decision boundaries 712, 714 may be implemented.

Thus, in an example embodiment, a first logistic classifier based on the graph of FIG. 7A and/or the decision boundary 702 may determine whether the first peak of a lightning pulse represents either the ground wave 704 or the first, second, or third ionospheric reflection 706, 708, 710. If it is determined that the first peak represents the first, second, or third ionospheric reflection 706, 708, 710, a second logistic classifier based on a graph similar to the graph of FIG. 7A and/or the decision boundary 712 may determine whether the first peak represents either the first ionospheric reflection 706 or the second or third ionospheric reflection 708, 710. If it is determined that the first peak represents the second or third ionospheric reflection 708, 710, a third logistic classifier based on a graph similar to the graph of FIG. 7A and/or the decision boundary 714 may determine whether the first peak represents either the second ionospheric reflection 708 or the third ionospheric reflection 710. Although not illustrated, if there are other subsequent ionospheric reflections beyond the third ionospheric reflection, other logistic classifiers may be implemented, as needed, to determine the lobe of the first peak of the lightning pulse.

After the node of the first peak of the lightning pulse is determined, the polarity of the lightning discharge as detected at the corresponding lightning detection sensor may then be determined as the negative of the polarity of the first peak if the node of the first peak is an odd ionospheric reflection, or by using the polarity of the first peak as the polarity of the lightning discharge if the node of the first peak is the ground wave or an even ionospheric reflection.

Accordingly, embodiments of methods for determining polarity of a lightning discharge as described herein may consider multiple waveform features in combination with an initial estimate of the propagation path and distance, such as the delay between the average arrival time of the lightning pulse and the onset-corrected arrival time of the first peak, the ratio between the amplitude of the first peak and subsequent peaks and/or the largest peak, and/or other waveform features.

Figure 8:
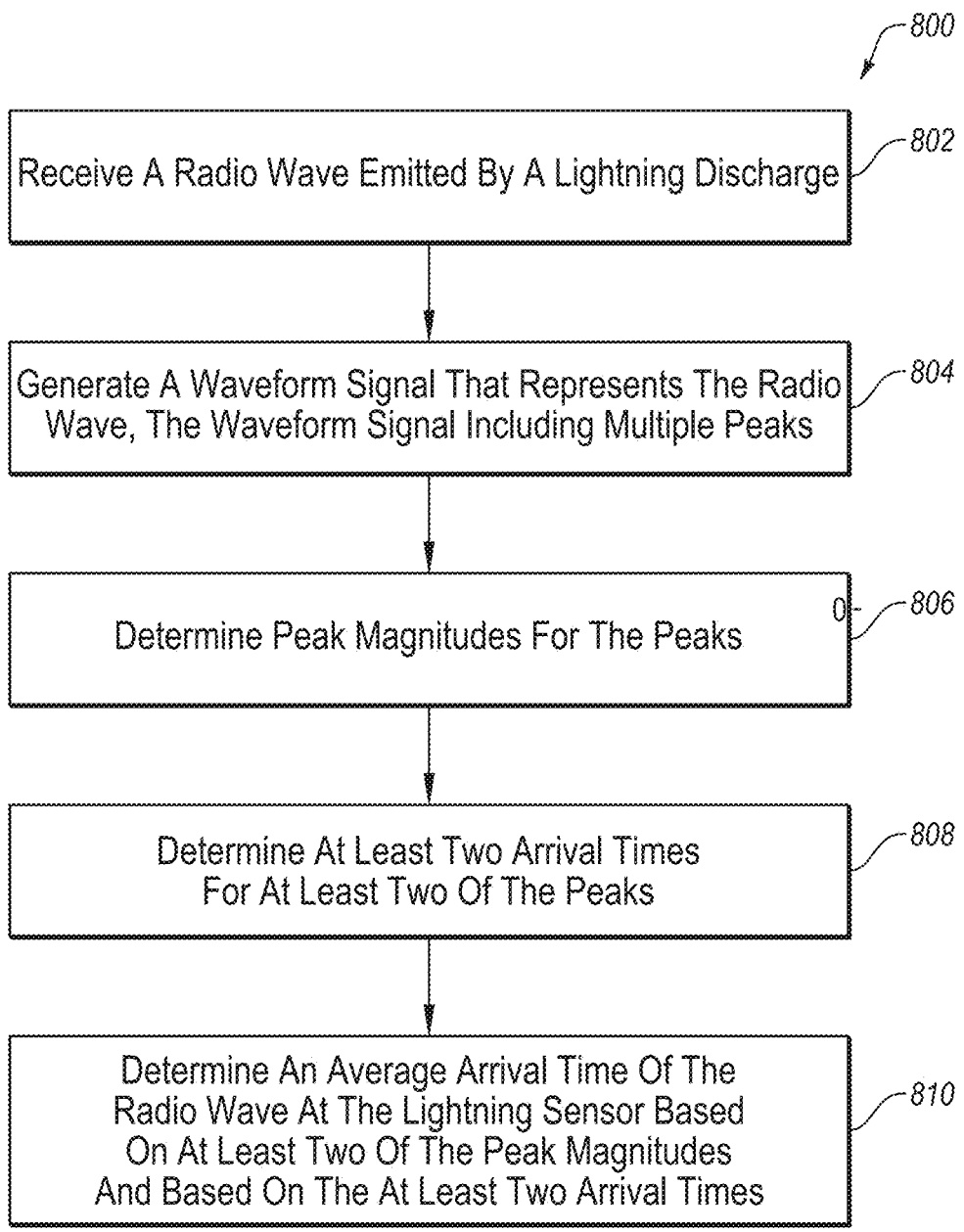
FIG. 8 is a flow chart of an example method to determine an average arrival time of a radio wave at a lightning detection sensor.

FIG. 8 is a flow chart of an example method 800 to determine an average arrival time of a radio wave at a lightning detection sensor, arranged in accordance with at least one embodiment described herein. The method 800 may be performed by any suitable system, apparatus, or device. For example, each lightning detection sensor, or one or more lightning detection sensors, in a lightning detection system may perform the method 800 of FIG. 8 to determine an average arrival time of each radio wave, e.g., each lightning pulse, at the corresponding lightning detection sensor. In particular, one or more of the sensors 110, 112 of FIG. 1 may perform the method 800 of FIG. 8. Although illustrated with discrete blocks, the steps and operations associated with one or more of the blocks of the method 800 may be divided into additional blocks, combined into fewer blocks, or eliminated, depending on the desired implementation. The method 800 may begin at block 802.

At block 802 ["Receive A Radio Wave Emitted By A Lightning Discharge"], a radio wave or lightning pulse emitted by a lightning discharge may be received at a lightning detection sensor. Block 802 may be followed by block 804.

At block 804 ["Generate A Waveform Signal That Represents The Radio Wave, The Waveform Signal Including Multiple Peaks"], a waveform signal that represents the radio wave may be generated at the lightning detection sensor. The waveform signal may be generated from the radio wave by, e.g., an antenna and/or ADC, such as the antenna 202 and the ADC 204 of FIG. 2. The waveform signal may include one or more peaks. In some embodiments, the waveform signal may include multiple peaks. Block 804 may be followed by block 806.

At block 806 ["Determine Peak Magnitudes For The Peaks"], multiple peak magnitudes may be determined for the peaks. In particular, a peak magnitude may be determined for each peak. Block 806 may be followed by block 808.

At block 808 ["Determine At Least Two Arrival Times For At Least Two Of The Peaks"], at least two arrival times may be determined for at least two of the peaks. In particular, an arrival time may be determined for each of at least two of the peaks. Each of the arrival times may include an onset-corrected arrival time or other suitable arrival time. Determining at least two arrival times for at least two of the peaks may include determining at least two arrival times for: a maximum peak having a corresponding peak magnitude that is greater than the corresponding peak magnitude of every other peak; and a preceding peak having a corresponding arrival time that precedes the corresponding arrival time of the maximum peak and having a corresponding peak magnitude that exceeds a threshold magnitude. The threshold magnitude may include the corresponding peak magnitude of the maximum peak multiplied by a constant. The constant may be 0.35, or other value between 0 and 1. Block 808 may be followed by block 810.

At block 810 ["Determine An Average Arrival Time Of The Radio Wave At The Lightning Sensor Base On At Least Two Of The Peak Magnitudes And Based On The At Least Two Arrival Times"], an average arrival time of the radio wave at the lightning sensor may be determined based on at least two of the peak magnitudes and based on the at least two arrival times. Determining the average arrival time of the radio wave may include determining a weighted average of the at least two of the arrival times. Determining the weighted average may include weighting the at least two of the arrival times based on the at least two of the peak magnitudes. In some embodiments, determining the average arrival time of the radio wave may include determining the average arrival time according to equation 1 as described elsewhere herein. Alternatively or additionally, determining the average arrival time of the radio wave may include giving more weight to the corresponding arrival time of the maximum peak as a difference between the corresponding peak magnitude of the maximum peak and the corresponding peak magnitude of a preceding peak increases.

One skilled in the art will appreciate that, for the method 800 and other processes and methods disclosed herein, the functions performed in the processes and methods may be implemented in differing order. Furthermore, the outlined steps and actions are only provided as examples, and some of the steps and actions may be optional, combined into fewer steps and actions, or expanded into additional steps and actions without detracting from the essence of the disclosed embodiments.

For example, the method 800 may further include determining an estimated propagation distance of the radio wave from the lightning discharge to the lightning detection sensor. Determining the estimated propagation distance may be performed by a server and/or may include making a crude geolocation calculation of the lightning discharge based on average arrival times of the lightning discharge at multiple lightning detection sensors and calculating the distance between the crude geolocation of the lightning discharge and a geolocation of the lightning detection sensor as the estimated propagation distance. Alternatively or additionally, the crude geolocation calculation may be made based on arrival angles at multiple lightning detection sensors or a combination of arrival angles and arrival times (average arrival times or others). Alternatively or additionally, estimating the propagation distance may include estimating the propagation distance using a waveform bank, e.g., as described in U.S. Pat. No. 8,073,622, which is incorporated herein by reference. Alternatively or additionally, measurements from a different observation system (e.g., different from the lightning detection system), such as a satellite system, may be used to estimate the propagation distance.

Alternatively or additionally, the method 800 may further include determining whether a first peak included in the peaks represents a ground wave from the lightning discharge or a particular one of multiple ionospheric reflections of the ground wave based on a delay between the corresponding arrival time of the first peak and the average arrival time of the radio wave. Determining whether the first peak represents the ground wave or a particular one of multiple ionospheric reflections may be performed by the server.

Alternatively or additionally, the method 800 may further include determining a polarity of the lightning discharge based on the determination of whether the first peak represents the ground wave or the particular one of the multiple ionospheric reflections. Determining the polarity of the lightning discharge based on the determination of whether the first peak represents the ground wave or the particular one of the multiple ionospheric reflections may be performed by the server.

As previously mentioned, the method 800 may be performed and/or controlled by a lightning detection sensor, such as the sensor 200 of FIG. 2. In these and other embodiments, the memory 208 and/or other computer storage medium of the sensor 200 may have computer-readable instructions stored thereon that are executable by a processor device, such as the processor 206, to perform or control performance of one or more of the operations of the method 800 of FIG. 8.

Figure 9:
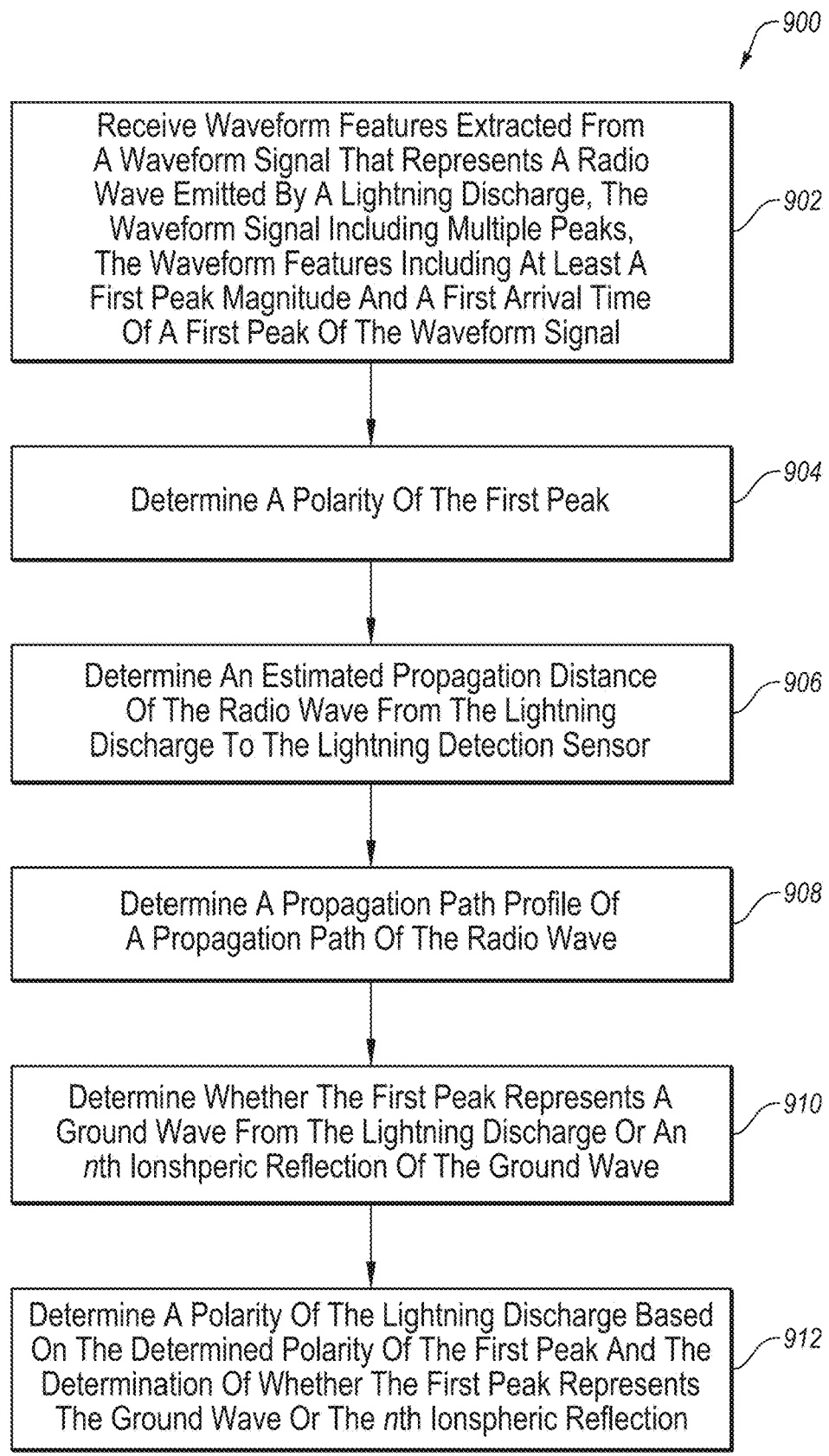
FIG. 9 is a flow chart of an example method to determine polarity of a lightning discharge, and FIG. 10 includes a block diagram of an example computational system, all arranged in accordance with at least one embodiment described herein.

FIG. 9 is a flow chart of an example method 900 to determine polarity of a lightning discharge, arranged in accordance with at least one embodiment described herein. The method 900 may be performed by any suitable system, apparatus, or device. For example, a central server within a lightning detection system, such as the server 106 of the system 100 of FIG. 1, may perform the method 900 of FIG. 9 to determine the polarity of one or more lightning discharges detected by the system. Although illustrated with discrete blocks, the steps and operations associated with one or more of the blocks of the method 900 may be divided into additional blocks, combined into fewer blocks, or eliminated, depending on the desired implementation. The method 900 may begin at block 902.

Block 902 ["Receive Waveform Features Extracted From A Waveform Signal That Represents A Radio Wave Emitted By A Lightning Discharge, The Waveform Signal Including Multiple Peaks, The Waveform Features Including At Least A First Peak Magnitude And A First Arrival Time Of A First Peak Of The Waveform Signal"], waveform features extracted from a waveform signal that represents a radio wave emitted by a lightning discharge may be received, e.g., from a lightning detection sensor. The waveform features may include at least a first peak magnitude and a first arrival time of a first peak of the waveform signal. Alternatively or additionally, the waveform features may include an average arrival time of the radio wave, e.g., calculated according to equation 1 and/or according to the method 800 of FIG. 8, at the corresponding lightning detection sensor, other peak magnitude(s) and other arrival time(s) of other peak(s), arrival angle data, and/or other features such as the relative amplitude progression of the peak magnitudes. Block 902 may be followed by block 904.

At block 904 ["Determine A Polarity Of The First Peak"], a polarity of the first peak of the waveform signal may be determined. The polarity of the first peak may be determined according to any suitable method, an example of which may include using the polarity of the electric field measurement. An example of using the polarity of the electric field measurement to determine the polarity of the first peak is described in Uman, Martin A., D. Kenneth McLain, and E. Philip Krider. "The electromagnetic radiation from a finite antenna." *American Journal of Physics* 43.1 (1975): 33-38, which is incorporated herein by reference. Block 904 may be followed by block 906.

At block 906 ["Determine An Estimated Propagation Distance Of The Radio Wave From The Lightning Discharge To The Lightning Detection Sensor"], an estimated propagation distance of the radio wave from the lightning discharge to the lightning detection sensor may be determined. Determining the estimated propagation distance may include making a crude geolocation calculation of the lightning discharge based on average arrival times of the lightning discharge at multiple lightning detection sensors and calculating the distance between the crude geolocation of the lightning discharge and a geolocation of the lightning detection sensor as the estimated propagation distance. The average arrival times used for the crude geolocation may be included in waveform features received from each of multiple lightning detection sensors and/or may be calculated according to the method 800 of FIG. 8 and/or equation 1. Block 906 may be followed by block 908.

At block 908 ["Determine A Propagation Path Profile Of A Propagation path Of The Radio Wave"], a propagation profile of the radio wave from the lightning discharge to the lightning detection sensor may be determined using the crude geolocation. A variety of features from the propagation path can then be used in the logistic regression classifier, including the estimated propagation distance. Additionally, separate logistic classifiers may be employed based on properties of the propagation profile, such as using a unique classifier for a daytime or a nighttime ionospheric profile. Block 908 may be followed by block 910.

At block 910 ["Determine Whether The First Peak Represents A Ground Wave From The Lightning Discharge Or An nth Ionospheric Reflection Of The Ground Wave"], the lobe of the first peak may be determined, e.g., it may be determined whether the first peak represents a ground wave from the lightning discharge or an nth ionospheric reflection of the ground wave, where n is a positive integer. The lobe determination may be based on the estimated propagation distance, the propagation path profile, and at least some of the waveform features. In some embodiments, the lobe determination may be made as described, e.g., with respect to FIGS. 7A and 7B.

Alternatively or additionally, determining whether the first peak represents the ground wave or the nth ionospheric reflection may include determining a delay between an average arrival time of the radio wave at the lightning detection sensor and the first arrival time of the first peak (e.g., $T_{ave}-t_0$) and executing a logistic classifier that is specific to the determined propagation path profile and that determines whether the first peak represents either the ground wave or one of the nth ionospheric reflections depending on the delay and the estimated propagation distance. In other embodiments, the logistic classifier may determine whether the first peak represents either the ground wave or one of the nth ionospheric reflections depending on different or additional features, such as the ratio between the amplitude of the first peak and subsequent peaks and/or the largest peak.

Multiple logistic classifiers may be implemented, as needed. For example, the logistic classifier may include a first logistic classifier that determines that the first peak represents one of the nth ionospheric reflections, in which case determining whether the first peak represents the ground wave or the nth ionospheric reflection may further include executing a second logistic classifier that is specific to the determined propagation path profile and that determines whether the first peak represents either the first ionospheric reflection or a subsequent one of the nth ionospheric reflections depending on the delay and the estimated propagation distance and/or other features. Additional logistic classifiers may be used, as needed. Block 910 may be followed by block 912.

At block 912 ["Determine A Polarity Of The Lightning Discharge Based On The Determined Polarity Of The First Peak And The Determination Of Whether The First Peak Represents The Ground Wave Or The nth Ionospheric Reflection"], a sensor-specific polarity of the lightning discharge for the lightning detection sensor may be determined based on the determined polarity of the first peak and the determination of whether the first peak represents the ground wave or the nth ionospheric reflection.

In some embodiments, determining the sensor-specific polarity of the lightning discharge based on the determined polarity of the first peak and the determination of whether the first peak represents the ground wave or the nth ionospheric reflection includes either determining that the polarity of the lightning discharge is the determined polarity of the first peak in response to determining that the first peak represents the ground wave or the nth ionospheric reflection where n is an even integer or determining that the polarity of the lightning discharge is the negative of the determined polarity of the first peak in response to determining that the first peak represents the nth ionospheric reflection where n is an odd integer.

Embodiments of the method 900 may include more, fewer, and/or different steps than illustrated in FIG. 9. For example, the method 900 may be implemented multiple times on different data sets of the same lightning discharge, e.g., on data from multiple lightning detection sensors, to determine the sensor-specific polarity of the lightning discharge for each of the lightning detection sensors. Optionally, the method 900 may further include determining a final polarity of the lightning discharge based on the sensor-specific polarity determinations based on data from multiple different lightning detection sensors.

In this and other embodiments, the lightning detection sensor previously discussed with respect to FIG. 9 may be referred to as a first lightning detection sensor. Accordingly, the method 900 may further include receiving, from multiple other lightning detection sensors, corresponding waveform features extracted from a corresponding waveform signal that represents the radio wave emitted by the lightning discharge, the corresponding waveform signal including corresponding peaks, the corresponding waveform features including at least a corresponding first peak magnitude and a corresponding first arrival time of a corresponding first peak of the corresponding waveform signal. For each of the corresponding lightning detection sensors, a corresponding polarity of each of the corresponding first peaks may be determined. A corresponding estimated propagation distance of the radio wave from the lightning discharge to the corresponding lightning detection sensor may be determined. A corresponding propagation path profile of a corresponding propagation path of the radio wave from the lightning discharge to the corresponding lightning detection sensor may be determined. It may also be determined whether the corresponding first peak represents the ground wave from the lightning discharge or the nth ionospheric reflection of the ground wave based on the corresponding estimated propagation distance, the corresponding propagation path profile, and at least some of the corresponding waveform features. A corresponding sensor-specific polarity of the lightning discharge for the corresponding lightning detection sensor may be determined based on the determined corresponding polarity of the corresponding first peak and the corresponding determination of whether the corresponding first peak represents the ground wave or the nth ionospheric reflection.

The method 900 may further include determining a final polarity of the lightning discharge based on the determined sensor-specific polarities of the lightning discharge for the contributing lightning detection sensors. A "contributing lightning detection sensor" may refer to any lightning detection sensor that generates sufficient data to make the corresponding sensor-specific polarity determination of the lightning discharge. Determining the final polarity of the lightning discharge may include applying a weighted majority rule to all contributing sensor-specific polarity determinations (e.g., the polarity determinations based on data from the contributing lightning detection sensors). According to an example embodiment of the weighted majority rule, an adjustable weighting factor may be applied to the corresponding sensor-specific polarity determination of the lightning discharge for each of the contributing lightning detection sensors. For example, the adjustable weighting factor may be set to near 0 for sensor-specific polarity determinations based on data from lightning detection sensors that are more than a threshold distance, such as 7,000 km, from the lightning discharge. Alternatively or additionally, sensor-specific polarity determinations based on data from lightning detection sensors in a threshold range of distances, such as 1,000 km to 2,000 km, from the lightning discharge and under a nighttime ionosphere may be down-weighted since the decision boundary in this propagation range under nighttime ionosphere may be subject to more geographical variation due to a more variable ionosphere.

As previously mentioned, the method 900 may be performed and/or controlled by a central server, such as the server 106 of FIG. 1. In these and other embodiments, a memory and/or other computer storage medium of the server 106 may have computer-readable instructions stored thereon that are executable by a processor device to perform or control performance of one or more of the operations of the method 900 of FIG. 9.

Each of the methods 800 and 900 of FIGS. 8 and 9 may be used independently and/or together, in any combination. For example, embodiments described herein may include combinations of one or more of the acts or operations of the method 800 of FIG. 8 with one or more of the acts or operations of the method 900 of FIG. 9.

FIG. 10 includes a block diagram of an example computational system 1000, arranged in accordance with at least one embodiment described herein. The computational system 1000 may be used to perform and/or control performance of any of the embodiments described herein. For example, the computational system 1000 may be used alone or in conjunction with other components. As another example, the computational system 1000 may be used to perform any calculation, solve any equation, perform any identification, and/or make any determination described herein. The computational system 1000 is an example implementation some or all of the server 106 of FIG. 1 and/or the sensor 110, 112, 200 of FIGS. 1 and 2.

The computational system 1000 may include any or all of the hardware elements shown in FIG. 10 and described herein. The computational system 1000 may include hardware elements that may be electrically coupled via a bus 1002 (or may otherwise be in communication, as appropriate). The hardware elements may include one or more processors 1004, including one or more general-purpose processors and/or one or more special-purpose processors (such as digital signal processing chips, graphics acceleration chips, and/or other suitable processors); one or more input devices 1008, which may include a mouse, a keyboard, or other suitable input device; and one or more output devices 1010, which may include a display device, a printer, and/or other suitable output devices.

The computational system 1000 may further include (and/or be in communication with) one or more storage devices 1006, which may include local and/or network-accessible storage, a disk drive, a drive array, an optical storage device, a solid-state storage device, such as a RAM, and/or ROM, which may be programmable, flash-updateable, and/or the like. The computational system 1000 may also include a communication subsystem 1012, which may include a modem, a network card (wireless or wired), an infrared communication device, a wireless communication device, and/or chipset (such as a Bluetooth® device, a 802.6 device, a Wi-Fi device, a WiMAX device, cellular communication facilities, etc.), and/or the like. The communication subsystem 1012 may permit data to be exchanged with a network (such as the networks described herein) and/or any other systems and/or devices described herein. In many embodiments, the computational system 1000 may further include a working memory 1014, which may include a RAM or ROM device, as described above.

The computational system 1000 may also include software elements, which may be located within the working memory 1014. Also, the computational system 1000 may include an operating system 1016 and/or other code, such as one or more application programs 1018, which may include computer programs, and/or may be designed to implement the methods, and/or configure the systems, as described herein. For example, one or more operations or procedures described with respect to the method(s) discussed above might be implemented as code and/or instructions executable by a computer (and/or a processor within a computer). A set of these instructions and/or codes may be stored on a computer-readable storage medium, such as the storage device(s) 1006 described above.

In some embodiments, the storage medium may be incorporated within the computational system 1000 or in communication with the computational system 1000. In other embodiments, the storage medium may be separate from the computational system 1000 (e.g., a removable medium, such as a compact disc, etc.), and/or provided in an installation package, such that the storage medium may be used to program a general-purpose computer with instructions/code stored thereon. These instructions may take the form of executable code, which may be executable by the computational system 1000 and/or may take the form of source and/or installable code, which, upon compilation and/or installation on the computational system 1000 (e.g., using any of a variety of generally available compilers, installation programs, compression/decompression utilities, etc.), takes the form of executable code.

Various embodiments are disclosed herein. The various embodiments may be partially or completely combined to produce other embodiments.

A phrase such as "an aspect" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as "an aspect" may refer to one or more aspects and vice versa. A phrase such as "an embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples of the disclosure. A phrase such as "an embodiment" may refer to one or more embodiments and vice versa. A phrase such as "a configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such as "a configuration" may refer to one or more configurations and vice versa.

A reference to an element in the singular is not intended to mean "one and only one" unless specifically stated, but rather "one or more." Pronouns in the masculine (e.g., his) include the feminine and neuter gender (e.g., her and its) and vice versa. The term "some" refers to one or more. Moreover, nothing disclosed herein is intended to be dedicated to the public regardless of whether such disclosure is explicitly recited in the above description.

The present disclosure is not to be limited in terms of the particular embodiments described herein, which are intended as illustrations of various aspects. Many modifications and variations can be made without departing from its spirit and scope. Functionally equivalent methods and apparatuses within the scope of the disclosure, in addition to those enumerated herein, are possible from the foregoing descriptions. Such modifications and variations are intended to fall within the scope of this disclosure. Also, the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

In general, terms used herein, and especially in the appended claims (e.g., bodies of the appended claims) are generally intended as "open" terms (e.g., the term "including" should be interpreted as "including but not limited to," the term "having" should be interpreted as "having at least" the term "includes" should be interpreted as "includes but is not limited to," etc.). It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general, such a construction is intended in the sense one having skill in the art would understand the convention (e.g., "a system having at least one of A, B, and C" would include but not be limited to systems that include A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that include A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

For any and all purposes, such as in terms of providing a written description, all ranges disclosed herein also encompass any and all possible sub ranges and combinations of sub ranges thereof. Any listed range can be easily recognized as sufficiently describing and enabling the same range being broken down into at least equal halves, thirds, quarters, fifths, tenths, and/or others. As a non-limiting example, each range discussed herein can be readily broken down into a lower third, middle third and upper third, etc. All language such as "up to," "at least," and the like include the number recited and refer to ranges which can be subsequently broken down into sub ranges as discussed above. Finally, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, various embodiments of the present disclosure have been described herein for purposes of illustration, and various modifications may be made without departing from the scope and spirit of the present disclosure. Accordingly, the various embodiments disclosed herein are not intended to be limiting.

What is claimed is:

1. A method, comprising:
   receiving, at an antenna of a lightning detection sensor, a radio wave emitted by a lightning discharge;
   generating, at the antenna and an analog-to-digital converter (ADC) of the lightning detection sensor, a waveform signal that represents the radio wave, the waveform signal including a plurality of peaks;
   a processor determining a plurality of peak magnitudes for the plurality of peaks, including determining a corresponding peak magnitude for each of the plurality of peaks;
   the processor determining at least two arrival times for at least two of the plurality of peaks, including determining a corresponding arrival time for each of the at least two of the plurality of peaks; and
   the processor determining an average arrival time of the radio wave at the lightning detection sensor based on at least two of the plurality of peak magnitudes and based on the at least two of the plurality of arrival times.

2. The method of claim 1, wherein determining the average arrival time based on the at least two of the plurality of peak magnitudes and based on the at least two of the plurality of arrival times comprises determining a weighted average of the at least two of the plurality of arrival times.

3. The method of claim 2, wherein determining the weighted average of the at least two of the plurality of arrival times comprises weighting the at least two of the plurality of arrival times based on the at least two of the plurality of peak magnitudes.

4. The method of claim 1, wherein determining at least two arrival times for at least two of the plurality of peaks comprises determining at least two arrival times for:
   a maximum peak having a corresponding peak magnitude that is greater than the corresponding peak magnitude of every other peak of the plurality of peaks; and
   a preceding peak having a corresponding arrival time that precedes the corresponding arrival time of the maximum peak and having a corresponding peak magnitude that exceeds a threshold magnitude.

5. The method of claim 4, wherein the threshold magnitude comprises the corresponding peak magnitude of the maximum peak multiplied by a constant.

6. The method of claim 5, wherein the constant comprises 0.35.

7. The method of claim 1, wherein determining the average arrival time of the radio wave based on the at least two of the plurality of peak magnitudes and based on the at least two of the plurality of arrival times comprises determining the average arrival time of the radio wave according to:

$$T_{ave} = \frac{1}{1-C} \sum_{i=1}^{M} t_i \left( \frac{|A_i| - |A_{i-1}|}{|A_{peak}|} \right);$$

wherein:
   $T_{ave}$ is the average arrival time of the radio wave;
   C is a constant between 0 and 1;
   $|A_{peak}|$ is the corresponding peak magnitude of a maximum peak of the plurality of peaks, the corresponding peak magnitude of the maximum peak being greater than the corresponding peak magnitude of every other peak of the plurality of peaks;
   M is a number of the plurality of peaks that each has a corresponding peak magnitude that exceeds a threshold $C*|A_{peak}|$ and that each has a corresponding arrival time that is less than or equal to the corresponding arrival time of the maximum peak;
   i is an integer from 1 to M;
   $|A_i|$ is the corresponding peak magnitude of an ith peak of the plurality of peaks;
   $t_i$ is the corresponding arrival time of the ith peak of the plurality of peaks; and
   $A_0$ is equal to $C*|A_{peak}|$.

8. The method of claim 1, wherein determining the average arrival time of the radio wave based on the at least two of the plurality of peak magnitudes and based on the at least two of the plurality of arrival times comprises giving more weight to the corresponding arrival time of a maximum peak of the plurality of peaks as a difference between the corresponding peak magnitude of the maximum peak and the corresponding peak magnitude of a preceding peak of the plurality of peaks increases.

9. The method of claim 1, further comprising determining an estimated propagation distance of the radio wave from the lightning discharge to the lightning detection sensor.

10. The method of claim 1, further comprising determining whether a first peak included in the plurality of peaks represents a ground wave from the lightning discharge or a particular one of a plurality of ionospheric reflections of the ground wave.

11. A non-transitory computer storage medium having computer-readable instructions stored thereon that are executable by a processor device to perform or control performance of the method of claim 1.

12. A lightning detection sensor comprising:
   an antenna configured to receive a radio wave emitted by a lightning discharge;
   an analog-to-digital converter (ADC) operatively coupled to the antenna, the antenna and the ADC together configured to generate a waveform signal that represents the radio wave, the waveform signal including a plurality of peaks;
   a processor device operatively coupled to the ADC; and
   a computer storage medium operatively coupled to the processor device, the computer storage medium having computer-readable instructions stored thereon that are executable by the processor device to perform or control performance of operations comprising:
      determining a plurality of peak magnitudes for the plurality of peaks, including determining a corresponding peak magnitude for each of the plurality of peaks;
      determining at least two arrival times for at least two of the plurality of peaks, including determining a corresponding arrival time for each of the at least two of the plurality of peaks; and
      determining an average arrival time of the radio wave at the lightning detection sensor based on at least two of the plurality of peak magnitudes and based on the at least two of the plurality of arrival times.

13. A method, comprising:
   a processor receiving, from a lightning detection sensor, waveform features extracted from a waveform signal that represents a radio wave emitted by a lightning discharge, the waveform signal including a plurality of peaks, the waveform features including at least a first peak magnitude and a first arrival time of a first peak of the waveform signal;

the processor determining a polarity of the first peak;

the processor determining an estimated propagation distance of the radio wave from the lightning discharge to the lightning detection sensor;

the processor determining a propagation path profile of the radio wave from the lightning discharge to the lightning detection sensor;

the processor determining whether the first peak represents a ground wave from the lightning discharge or an nth ionospheric reflection of the ground wave based on the estimated propagation distance, the propagation path profile, and at least some of the waveform features, wherein n comprises a positive integer; and the processor determining a sensor-specific polarity of the lightning discharge for the lightning detection sensor based on the determined polarity of the first peak and the determination of whether the first peak represents the ground wave or the nth ionospheric reflection.

14. The method of claim 13, wherein determining the polarity of the lightning discharge based on the determined polarity of the first peak and the determination of whether the first peak represents the ground wave or the nth ionospheric reflection comprises one of:

determining that the polarity of the lightning discharge is the determined polarity of the first peak in response to determining that the first peak represents the ground wave or the nth ionospheric reflection where n is an even integer; or determining that the polarity of the lightning discharge is the negative of the determined polarity of the first peak in response to determining that the first peak represents the nth ionospheric reflection where n is an odd integer.

15. The method of claim 13, wherein determining the propagation path profile of the propagation path of the radio wave comprises determining that the propagation path has a daytime ionospheric profile, a nighttime ionospheric profile, or a mixed daytime and nighttime ionospheric profile.

16. The method of claim 13, wherein determining whether the first peak represents the ground wave or the nth ionospheric reflection based on the estimated propagation distance, the propagation path profile, and the at least some of the waveform features comprises:

determining a delay between an average arrival time of the radio wave at the lightning detection sensor and the first arrival time of the first peak; and executing a logistic classifier that is specific to the determined propagation path profile and that determines whether the first peak represents either the ground wave or one of the nth ionospheric reflections depending on the delay and the estimated propagation distance.

17. The method of claim 16, wherein:

the logistic classifier determines that the first peak represents one of the nth ionospheric reflections;

the logistic classifier comprises a first logistic classifier; and determining whether the first peak represents the ground wave or the nth ionospheric reflection further comprises executing a second logistic classifier that is specific to the determined propagation path profile and that determines whether the first peak represents either the first ionospheric reflection or a subsequent one of the nth ionospheric reflections depending on the delay and the estimated propagation distance.

18. The method of claim 13, wherein determining whether the first peak represents the ground wave or the nth ionospheric reflection based on the estimated propagation distance, the propagation path profile, and the at least some of the waveform features comprises:

determining a ratio of an amplitude of a first peak of the plurality of peaks to an amplitude of a subsequent peak of the plurality of peaks; and executing a logistic classifier that is specific to the determined propagation path profile and that determines whether the first peak represents either the ground wave or one of the nth ionospheric reflections depending on the ratio and the estimated propagation distance.

19. The method of claim 13, wherein the lightning detection sensor comprises a first lightning detection sensor, the method further comprising:

receiving, from a plurality of other lightning detection sensors, corresponding waveform features extracted from a corresponding waveform signal that represents the radio wave emitted by the lightning discharge, the corresponding waveform signal including a corresponding plurality of peaks, the corresponding waveform features including at least a corresponding first peak magnitude and a corresponding first arrival time of a corresponding first peak of the corresponding waveform signal;

for each corresponding lightning detection sensor of the plurality of other lightning detection sensors:

determining a corresponding polarity of each of the corresponding first peaks;

determining a corresponding estimated propagation distance of the radio wave from the lightning discharge to the corresponding lightning detection sensor;

determining a corresponding propagation path profile of a corresponding propagation path of the radio wave from the lightning discharge to the corresponding lightning detection sensor;

determining whether the corresponding first peak represents the ground wave from the lightning discharge or the nth ionospheric reflection of the ground wave based on the corresponding estimated propagation distance, the corresponding propagation path profile, and at least some of the corresponding waveform features; and determining a corresponding sensor-specific polarity of the lightning discharge for the corresponding lightning detection sensor based on the determined corresponding polarity of the corresponding first peak and the corresponding determination of whether the corresponding first peak represents the ground wave or the nth ionospheric reflection.

20. The method of claim 19, further comprising determining a final polarity of the lightning discharge based on the determined sensor-specific polarity of the lightning discharge for the lightning detection sensor and based on each determined corresponding sensor-specific polarity of the lightning discharge for each of the corresponding lightning detection sensors.

21. The method of claim 20, wherein determining the final polarity of the lightning discharge comprises applying a weighted majority rule to all contributing sensor-specific polarity determinations in which an adjustable weighting factor is applied to the determined sensor-specific polarity of the lightning discharge for the lightning detection sensor and each determined corresponding sensor-specific polarity of the lightning discharge for each of the corresponding lightning detection sensors.

* * * * *